(12) United States Patent
Kato et al.

(10) Patent No.: US 10,424,514 B2
(45) Date of Patent: Sep. 24, 2019

(54) METHOD FOR MANUFACTURING SEMICONDUCTOR SUBSTRATE

(71) Applicant: MTEC CORPORATION, Nagakute-shi (JP)

(72) Inventors: Mitsuharu Kato, Nagakute (JP); Tamotsu Usami, Nagakute (JP); Tadashi Shimada, Nagakute (JP)

(73) Assignee: MTEC CORPORATION, Nagakute-shi (JP)

( * ) Notice: Subject to any disclaimer, the term of this patent is extended or adjusted under 35 U.S.C. 154(b) by 0 days.

(21) Appl. No.: 15/554,352

(22) PCT Filed: Mar. 1, 2016

(86) PCT No.: PCT/JP2016/056300
§ 371 (c)(1),
(2) Date: Aug. 29, 2017

(87) PCT Pub. No.: WO2016/140229
PCT Pub. Date: Sep. 9, 2016

(65) Prior Publication Data
US 2018/0047630 A1    Feb. 15, 2018

(30) Foreign Application Priority Data

Mar. 4, 2015   (JP) ................. 2015-042918

(51) Int. Cl.
*H01L 21/78* (2006.01)
*B23K 26/57* (2014.01)
(Continued)

(52) U.S. Cl.
CPC .......... *H01L 21/7806* (2013.01); *B23K 26/57* (2015.10); *H01L 21/02002* (2013.01);
(Continued)

(58) Field of Classification Search
CPC ................. H01L 21/76254; H01L 21/02002
See application file for complete search history.

(56) References Cited

U.S. PATENT DOCUMENTS 5,700,467 A * 12/1997 Shima ............... H01L 31/03765
136/249
8,624,357 B2 * 1/2014 Joshi ................. H01L 21/76254
257/618
(Continued)

FOREIGN PATENT DOCUMENTS

JP   2002-280531 A   9/2002
JP   2004-503942 A   2/2004
(Continued)

OTHER PUBLICATIONS

International Search Report dated Jun. 7, 2016 in PCT/JP2016/056300 (with English language translation).
(Continued)

*Primary Examiner* — Bilkis Jahan
*Assistant Examiner* — Victor V Barzykin
(74) *Attorney, Agent, or Firm* — Oblon, McClelland, Maier & Neustadt, L.L.P.

(57) ABSTRACT

A method for manufacturing a semiconductor substrate according to the present invention includes a hydrogen layer forming step of forming a hydrogen layer on a first substrate formed of single crystal of a first semiconductor material, a bonding step of bonding the first substrate and a temporary substrate, a first separation step of separating the first substrate with the hydrogen layer as a boundary and leaving a separated surface side of the first substrate as a first thin film layer on the temporary substrate, a support layer forming step of forming a support layer formed of a second semiconductor material on the temporary substrate on which the first thin film layer is left, a second separation step of
(Continued)

removing the temporary substrate, and a cutting step of cutting a peripheral edge portion of the substrate.

14 Claims, 16 Drawing Sheets

(51) Int. Cl.
   *H01L 21/02*    (2006.01)
   *H01L 21/762*   (2006.01)
   *H01L 29/16*    (2006.01)
   *H01L 29/78*    (2006.01)

(52) U.S. Cl.
   CPC .... *H01L 21/76254* (2013.01); *H01L 29/1608* (2013.01); *H01L 29/7802* (2013.01)

(56) References Cited

U.S. PATENT DOCUMENTS

| | | | |
|---|---|---|---|
| 2003/0129780 A1 | 7/2003 | Auberton-Herve | |
| 2011/0221040 A1* | 9/2011 | Joshi | H01L 21/02002 |
| | | | 257/618 |
| 2014/0225125 A1* | 8/2014 | Berger | H01L 21/56 |
| | | | 257/77 |
| 2014/0305916 A1* | 10/2014 | Wei | H01L 21/67092 |
| | | | 219/121.64 |
| 2015/0171045 A1* | 6/2015 | Berger | H01L 21/02002 |
| | | | 257/744 |
| 2015/0205943 A1 | 7/2015 | Takenaka et al. | |
| 2016/0204023 A1 | 7/2016 | Imaoka et al. | |

FOREIGN PATENT DOCUMENTS

| | | |
|---|---|---|
| JP | 2014-59863 A | 4/2014 |
| JP | 2014-75565 A | 4/2014 |
| JP | 2015-15401 A | 1/2015 |

OTHER PUBLICATIONS

Stephanie Essig, et al. "Fast atom beam-activated n-Si/n-GaAs wafer bonding with high interfacial transparency and electrical conductivity", Journal of Applied Physics, vol. 113, No. 20, 2013, pp. 203512-1-203512-6 (with cover page).

Jun Suda, et al. "Characterization of 4H-SiC homoepitaxial layers grown on 100-mm-diameter 4H-SiC/poly-SiC bonded substrates", The International Conference on Silicon Carbide and Related Material (ICSCRM) by Suda Kyoto University, 2013, pp. 1-4.

N. Hatta, et al. Low-resistance 4H-Sic/Poly-Sic Bonded Interfaces Fabricated by a Surface-Activated Bonding Method, The European Conference on Silicon Carbide and Related Materials (ECSCRM) by Hatta SICOXS Co., 2014, pp. 1-2.

* cited by examiner

METHOD FOR MANUFACTURING SEMICONDUCTOR SUBSTRATE

TECHNICAL FIELD

The present invention relates to a method for manufacturing a semiconductor substrate. More specifically, the present invention relates to a method for manufacturing a semiconductor substrate which allows low-cost manufacturing of a semiconductor substrate for a high withstand voltage device with few crystal defects.

BACKGROUND ART

A silicon carbide (hereinafter also referred to as "SiC") semiconductor substrate having a large bandgap width has attracted attention as a substrate of a semiconductor device for high voltage applications. FIG. 18 shows a cross-sectional structure of a MOSFET (100) having a general vertical structure formed of SiC. An active layer 120 is formed on an element support substrate 110 by epitaxial growth, and a source 101, a drain 102, and a gate 103 are formed in a region of the active layer 120. Conduction and cutoff of current between the source 101 and the drain 102 is controlled by the gate 103. A drain current i at the time of conduction flows between the drain 102 and a drain electrode 104 formed on a bottom surface of the element support substrate 110.

The element support substrate 110 is a region in which current flows in the vertical direction (up/down direction in the drawing) and has a low resistivity of 20 mΩ·cm or less. On the other hand, since the active layer 120 needs to withstand a high voltage, the active layer 120 has a resistivity higher by 2 to 3 digits than that of the element support substrate 110. Since a semiconductor device using SiC has a large bandgap width, it is characterized in that the thickness of the active layer 120 can be reduced to approximately 5 to 10 μm. The thickness of the element support substrate 110 is set to approximately 300 μm in the case of a 6-inch substrate in order to, for example, prevent cracking during handling of a single crystal substrate. Since the active layer 120 is formed by epitaxial growth on the element support substrate 110, its crystallinity depends on the element support substrate 110 which becomes a base. Thus, the crystal quality of SiC of the element support substrate 110 is important.

Since SiC is a compound consisting of carbon and silicon having different lattice constants, many crystal defects occur in an element substrate. Particularly, in power device applications, crystal defects are fatal, and therefore, various attempts have been made to reduce the crystal defects; however, the cost of the element substrate is accordingly increased. For this reason, it is aimed to simultaneously achieve crystal defect reduction and cost reduction of the element support substrate 110 which is a base of the active layer 120 to be epitaxially grown. In the case of the vertical structure as shown in FIG. 18, in order to flow current in the vertical direction, the element support substrate 110 needs to have a low resistivity, and therefore, high concentration nitrogen is added to provide an N-type semiconductor. However, there is a problem that crystal defects are further increased due to the high concentration nitrogen.

In order to reduce crystal defects and reduce costs, there has been known a method of bonding a single crystal layer having good crystallinity on a low cost polycrystalline substrate. For example, there is a substrate manufacturing method in which amorphous silicon is vapor-deposited on a polycrystalline SiC support, and the polycrystalline SiC support and a single crystal SiC substrate are bonded and integrated by direct bonding (refer to Patent Literature 1). There is also an example in which substrates are bonded together by a surface activation method using a FAB gun (Fast Atomic Gun) (refer to Non-Patent Literature 1). Further, in order to bond two semiconductor layers together, there is a method in which the surface of each semiconductor layer is irradiated with an inactive impurity such as argon to be temporarily made amorphous, and thus to be recrystallized by heat treatment after bonding the two semiconductor layers. By this method, it has been confirmed that there is continuity at the atomic level at two bonded interfaces (refer to Non Patent Literatures 1 and 2).

From these findings, it is also conceivable to form an inexpensive and highly crystalline substrate by bonding an inexpensive polycrystalline substrate irrespective of crystallinity and a single crystal substrate having good crystallinity.

However, since such a substrate has a bonding interface, if there is a partial bonding defect, this causes lowering of the yield of the element. In order to achieve defect-free bonding, if polishing is performed to increase flatness of surfaces of both substrates, there is a problem that the polishing cost becomes expensive. In addition, it is difficult to eliminate entrainment of particles caused by, for example, a bonding apparatus or various atomic components present at the bonding interface. The greatest problem of the method of forming the element substrate by bonding is that the bonding interface exists in a final semiconductor substrate.

In order to solve the above problem, a method for manufacturing a semiconductor substrate which, as a finished product, does not have a bonding interface has been proposed (refer to Patent Literature 2).

CITATIONS LIST

Patent Literature

Patent Literature 1: Japanese Unexamined Patent Publication No. 2004-503942
Patent Literature 2: Japanese Unexamined Patent Publication No. 2002-280531

Non Patent Literature

Non Patent Literature 1: S. Essig et al., Fast atom beam-activated n-Si/n-GaAs wafer bonding with high interfacial transparency and electrical conductivity, JOURNAL OF APPLIED PHYSICS 113, 203512 (2013)
Non Patent Literature 2: J. Suda et al., Characterization of 4H-SiC Homoepitaxial Layers Grown on 100-mm-Diameter 4H-SiC/Poly-SiC Bonded Substrates, ICSCRM 2013 by Suda Kyoto University, Author corrected paper: Th-P-62
Non Patent Literature 3: N. Hatta et al., Low-resistance 4H-SiC/Poly-SiC Bonded Interfaces Fabricated by a Surface-Activated-Bonding Method, ECSCRM 2014 by Hatta SICOXS Co.

SUMMARY OF INVENTION

Technical Problems

As described above, in the prior art, a substrate of a semiconductor element for high voltage application is manufactured by epitaxially growing a thin film layer formed of a single crystal on a surface layer of an element support substrate having a constant thickness. Since the crystallinity of this element support substrate is originally not limited, it is conceivable to use an inexpensive polycrystalline semiconductor substrate. However, in general, it is difficult to grow a single crystal semiconductor layer having good crystallinity on a semiconductor substrate irrespective of crystallinity. This is because only a layer irrespective of crystallinity can be grown on a thick layer irrespective of crystallinity. On the other hand, when the element support substrate is used as a single crystal semiconductor, it is not only costly, but also wasteful.

In order to solve this problem, there have been proposed various methods of forming an inexpensive and highly crystalline element substrate by bonding an inexpensive thick substrate irrespective of crystallinity and a thin film layer of a substrate having good crystallinity. However, according to a conventional manufacturing method of bonding a polycrystalline substrate and a single crystal substrate, since a bonding interface exists in a completed semiconductor substrate, it is difficult to obtain a high-quality semiconductor substrate. On the other hand, Patent Literature 2 discloses a method of manufacturing, by bonding, a semiconductor substrate which, as a finished product, does not have a bonding interface.

In the manufacturing method described in Patent Literature 2, after attaching a base substrate to a single crystal SiC substrate on which a muddy weak layer is formed, heat treatment is performed to peel off the single crystal SiC substrate with the muddy weak layer, whereby a base substrate for deposition in which the single crystal SiC layer is stacked on the base substrate is formed. Then, after depositing a support on the single crystal SiC layer, the base substrate is removed. Thus, it is said that a semiconductor substrate on which the support is deposited on the single crystal SiC layer which becomes an active region of the element can be obtained. However, usually, if a thick support layer is formed on a thin single crystal SiC layer, unevenness of internal stress occurs due to inhomogeneity of crystallinity, especially at its peripheral edge portion. Thus, there is a serious problem that warpage occurs after removing a temporary fixing means such as the base substrate. Particularly in the case of SiC, gas phase growth is performed at a high temperature of 1200 to 1600° C., and unevenness of stress tends to occur in a wafer peripheral edge portion.

Accordingly, in order to bond together an inexpensive substrate irrespective of crystallinity and a thin film layer of a substrate having good crystallinity and to put into practical use a high-quality semiconductor substrate which, as a finished product, does not have a bonding interface, it is necessary to improve the structure and process of providing the support layer and to remove unevenness of internal stress occurring in the semiconductor substrate.

The present invention has been made in view of the above state of the art, and aims to provide a method for manufacturing a semiconductor substrate which allows low-cost manufacturing of a semiconductor substrate for a high withstand voltage device with few crystal defects and a semiconductor substrate for a high withstand voltage device with few crystal defects.

Solutions to Problems

The present invention is as follows.
1. A method for manufacturing a semiconductor substrate including: a hydrogen layer forming step of implanting hydrogen ions at a predetermined depth from a surface of a first substrate formed of single crystal of a first semiconductor material to form a hydrogen layer; a bonding step of bonding the surface of the first substrate and a temporary substrate; a first separation step of separating the first substrate bonded to the temporary substrate with the hydrogen layer as a boundary to leave the separated surface side of the first substrate as a first thin film layer on the temporary substrate; a support layer forming step of forming a support layer formed of a second semiconductor material on the temporary substrate on which the first thin film layer is left; a second separation step of removing the temporary substrate to obtain a second substrate on which the first thin film layer is stacked on the support layer; and a cutting step of cutting a peripheral edge portion in a predetermined range from an outer periphery of the second substrate, wherein the first substrate has a disk shape or a columnar shape, an outer shape of a surface of the temporary substrate bonded to the first substrate is equal to or larger than a diameter of the first substrate, and in the cutting step, at least a portion exceeding the diameter of the first thin film layer is removed as the peripheral edge portion.

2. The method for manufacturing a semiconductor substrate according to the first aspect, wherein a bonding layer is formed on a surface of the temporary substrate bonded to the first substrate, and in the second separation step, the bonding layer is stacked on the second substrate by removing the temporary substrate while leaving the bonding layer, the manufacturing method further including a bonding layer removal step of removing the bonding layer from the second substrate.

3. The method for manufacturing a semiconductor substrate according to the second aspect, wherein the temporary substrate is a carbon substrate, and the bonding layer is formed of SiC polycrystal.

4. The method for manufacturing a semiconductor substrate according to the second aspect, wherein the temporary substrate is a SiC substrate, and the bonding layer is formed of $SiO_2$.

5. The method for manufacturing a semiconductor substrate according to the first aspect, wherein a first bonding layer is formed on the surface of the first substrate, a second bonding layer is formed on the surface of the temporary substrate bonded to the first substrate, in the bonding step, the surface of the first substrate on which the first bonding layer is formed and the surface of the temporary substrate on which the second bonding layer is formed are bonded to each other, the first bonding layer is formed of one of $SiO_2$ and Si, and the second bonding layer is formed of the other of $SiO_2$ and Si.

6. The method for manufacturing a semiconductor substrate according to the fifth aspect, wherein the temporary substrate is a carbon substrate, the first bonding layer is formed of Si, and the second bonding layer is formed of $SiO_2$.

7. The method for manufacturing a semiconductor substrate according to the first aspect, wherein a first bonding layer formed of $SiO_2$ is formed on the surface of the first substrate, the temporary substrate is a Si substrate, and in the bonding step, the surface of the first substrate on which the first bonding layer is formed and a surface of the Si substrate are bonded to each other.

8. The method for manufacturing a semiconductor substrate described in any one of the first to seventh aspects, further including a buffer layer forming step of forming a buffer layer formed of a third semiconductor material on the temporary substrate on the side where the first thin film layer is left in the first separation step, wherein in the support layer forming step, the support layer is formed on the buffer layer, and in the second substrate, the buffer layer and the first thin film layer are stacked on the support layer.

9. The method for manufacturing a semiconductor substrate according to the first to seventh aspects, wherein the first semiconductor material and the second semiconductor material are SiC, and the support layer is formed of single crystal or polycrystal.

10. The method for manufacturing a semiconductor substrate according to the first to seventh aspects, wherein the first semiconductor material is GaN or gallium oxide, the second semiconductor material is SiC, and the support layer is formed of single crystal or polycrystal.

11. The method for manufacturing a semiconductor substrate described in eighth aspect, wherein the third semiconductor material is SiC, and the buffer layer is polycrystalline or amorphous.

12. The method for manufacturing a semiconductor substrate described in any one of the first to seventh aspects, further including an impurity introducing step of introducing a high-concentration impurity into at least one of a surface layer portion of the first thin film layer and an interface portion of the support layer on the side of the first thin film layer.

A semiconductor substrate manufactured by the method for manufacturing a semiconductor substrate including: a first thin film layer formed of single crystal of a first semiconductor material; a support layer formed on the first thin film layer and formed of SiC polycrystal; and a single crystal layer for device formation formed on a surface of the first thin film layer opposite to the support layer and formed of single crystal, wherein the first semiconductor material is any one of SiC, GaN and gallium oxide, and the single crystal layer for device formation is formed of any one of SiC, GaN and gallium oxide.

A semiconductor substrate manufactured by the method for manufacturing a semiconductor substrate including: a first thin film layer formed of single crystal of a first semiconductor material; a buffer layer formed on the first thin film layer and formed of polycrystalline SiC or amorphous SiC; a support layer formed on the buffer layer and formed of SiC polycrystal; and a single crystal layer for device formation formed on a surface of the first thin film layer opposite to the support layer and formed of single crystal, wherein the first semiconductor material is any one of SiC, GaN and gallium oxide, and the single crystal layer for device formation is formed of any one of SiC, GaN and gallium oxide.

Advantageous Effects of Invention

According to the method for manufacturing a semiconductor substrate according to the present invention, the method includes a hydrogen layer forming step of forming a hydrogen layer on a first substrate formed of single crystal of a first semiconductor material, a bonding step of bonding the first substrate and a temporary substrate, a first separation step of separating the first substrate with the hydrogen layer as a boundary and leaving the first thin film layer on the temporary substrate, a support layer forming step of forming a support layer formed of a second semiconductor material, a second separation step of removing the temporary substrate to obtain a second substrate, and a cutting step of cutting a peripheral edge portion from the second substrate. Therefore, an inexpensive support layer irrespective of crystallinity is formed as a base, and a semiconductor substrate in which a single-crystal first thin film layer is stacked on its surface can be formed. That is, by reducing the thickness of the first thin film layer separated from the high-quality single-crystal first substrate, even if the single-crystal first substrate is expensive, the first thin film layer can be made low cost. Even though the support layer needs to have a thickness of several hundreds μm, crystallinity is not limited, so that film-formation with high speed growth can be achieved, and cost can be reduced.

Further, since there is no bonding interface between the first substrate and the temporary substrate on the final semiconductor substrate, it is possible to eliminate the presence of various metals produced at the bonding interface and bonding defects due to various particles mixed at the time of bonding. In addition, since a bonding surface between the first substrate and the temporary substrate is not necessarily complete, it is also possible to simplify flattening treatment of each substrate surface for bonding.

Then, since the peripheral edge portion of the second substrate is removed, a portion with uneven internal stress occurring particularly in the peripheral edge portion due to high-speed film formation of a support layer is cut and separated, and a practical semiconductor substrate with less warpage can be formed.

As described above, a high-quality thin single crystal layer, which is necessary for epitaxially growing single crystal to be an active layer of a semiconductor device, is formed on a low-cost support layer, and a semiconductor substrate with less warpage can be achieved at low cost.

The first substrate has a disk shape or a columnar shape, and the outer shape of the temporary substrate is equal to or larger than the diameter of the first substrate, and in the cutting step, at least the portion exceeding the diameter of the first thin film layer is removed as the peripheral edge portion in the predetermined range. Therefore, the first thin film layer formed of expensive single crystal can be fully used, and, at the same time, the warpage of the substrate can be reduced by effectively removing a wafer peripheral edge portion.

In the case where the bonding layer is formed on the surface of the temporary substrate bonded to the first substrate, in the second separation step the temporary substrate is removed leaving the bonding layer, and the semiconductor substrate manufacturing method includes the bonding layer removal step of removing the bonding layer from the second substrate, the temporary substrate can be easily removed, and the removed temporary substrate can be reused. Since the bonding layer is removed from the final semiconductor substrate in the bonding layer removal step, it is possible to obtain a highly crystalline and flat surface of the first thin film layer.

In the case where the temporary substrate is a carbon substrate and the bonding layer is formed of SiC polycrystal, it is possible to bond together the surface of the first substrate and the surface of the bonding layer after activation using a FAB gun or an ion beam, and a temporary substrate 4 can be easily separated by incineration of the carbon substrate or the like.

Further, in the case where the temporary substrate is a SiC substrate and the bonding layer is formed of $SiO_2$, the temporary substrate and the bonding layer can be easily bonded by interposing water at room temperature due to the effect of a hydroxy group, and the temporary substrate 4 can be separated by removing a $SiO_2$ layer with hydrofluoric acid or the like.

In the case where the first bonding layer is formed on the surface of the first substrate, the second bonding layer is formed on the surface of the temporary substrate bonded to the first substrate, in the bonding step, the surface of the first substrate on which the first bonding layer is formed and the surface of the temporary substrate on which the second bonding layer is formed are bonded to each other, the first bonding layer is formed of one of $SiO_2$ and Si, and the second bonding layer is formed of the other of $SiO_2$ and Si, bonding can be facilitated by an interface between hydroxy groups.

In the case where the temporary substrate is a carbon substrate, the first bonding layer is formed of Si, and the second bonding layer is formed of $SiO_2$, bonding between the first substrate and the carbon substrate is facilitated by an interface between hydroxy groups, and the carbon substrate can be easily removed by incineration or the like.

In the case where the first bonding layer formed of $SiO_2$ is formed on the surface of the first substrate, the temporary substrate is a Si substrate, and in the bonding step, the surface of the first substrate on which the first bonding layer is formed and the surface of the Si substrate are bonded to each other, the first substrate and the Si substrate can be easily bonded using a hydroxy group, and the Si substrate can be easily removed by grinding, etching or the like.

In the case of including the buffer layer forming step of forming the buffer layer formed of the third semiconductor material on the temporary substrate on the side where the first thin film layer is left, a buffer layer formed on the entire surface on the temporary substrate in which the first thin film layer exists can be planarized and uniformly formed. Since a support layer is formed on the buffer layer, it is possible to grow the support layer homogeneously and reduce crystal defects. In addition, unevenness of stress occurring in a peripheral edge portion of the support layer can be reduced.

In the case where the first semiconductor material and the second semiconductor material are SiC, and the support layer is formed of single crystal or polycrystal, it is possible to form a SiC semiconductor substrate in which a first thin film layer formed of SiC single crystal with good crystallinity and a SiC support layer irrespective of crystallinity are stacked. Consequently, a high-quality SiC active layer for a semiconductor device can be epitaxially grown on the first thin film layer which is high-quality SiC single crystal. Since the first thin film layer may be extremely thin (for example, 0.5 μm), even if SiC single crystal (first substrate) as a base material is expensive, only a portion thereof may be used.

Since the crystallinity of the support layer is not limited, the support layer which needs to have a thickness of approximately 300 μm can be grown at high speed without considering density of crystal defects, and a SiC semiconductor substrate can be manufactured at low cost. In addition, a SiC support layer irrespective of crystallinity can be made low resistance by adding nitrogen or the like at high concentration. In the prior art, in single crystal SiC, there is a limit to the nitrogen concentration due to such a contradictory event that the crystal defect increases as the nitrogen concentration is increased, and it is a limit that the resistivity is set to approximately 20 mΩ·cm. For example, the element support substrate 110 shown in FIG. 18 is formed of single crystal SiC, which serves as a base for epitaxially growing the active layer 120 and has a function as a support substrate. In order to lower the resistivity of the element support substrate 110 (to approximately 20 mΩ·cm), the nitrogen concentration is in an extremely high state, causing an increase in crystal defects. On the other hand, since the first thin film layer in the present invention does not need a function as a support substrate, crystal defects can be reduced by lowering the nitrogen concentration. On the other hand, in the SiC support layer irrespective of crystallinity, the resistivity can be lowered to 10 mΩ·cm or less by significantly increasing the nitrogen concentration. Further, the resistivity can be lowered by mixing other semiconductor materials with SiC. In this way, enabling of lowering resistance such that the resistance is significantly below single crystal SiC is a great advantage in applications of semiconductor devices in which current flows in a vertical direction of a substrate. Since a SiC layer irrespective of crystallinity can be made stronger than single crystal SiC, the thickness of the support layer can be made smaller than 300 μm, and the cost of the SiC semiconductor substrate can be further reduced.

In the case where the first semiconductor material is GaN or gallium oxide, the second semiconductor material is SiC, and the support layer is formed of single crystal or polycrystal, it is possible to form a semiconductor substrate in which a first thin film layer formed of GaN single crystal or gallium oxide with good crystallinity and a SiC support layer irrespective of crystallinity are stacked. Consequently, a high-quality GaN or gallium oxide single crystal layer for a semiconductor device can be epitaxially grown on the first thin film layer which is high-quality GaN single crystal or gallium oxide single crystal.

Since the crystallinity of the support layer formed of SiC is not limited, the support layer which needs to have a thickness of approximately 300 μm can be grown at high speed without considering density of crystal defects, and a semiconductor substrate can be manufactured at low cost.

In the case where the third semiconductor material is SiC, and the buffer layer is polycrystalline or amorphous, on the first thin film layer formed of SiC single crystal with good crystallinity, a SiC buffer layer serving as a base for thickly and uniformly growing a SiC support layer irrespective of crystallinity can be formed irrespective of crystallinity.

In the case of including the impurity introducing step of introducing a high-concentration impurity into the surface layer portion of the first thin film layer and/or the interface portion of the support layer on the side of the first thin film layer, interface resistance caused by a potential barrier between the first thin film layer which is single crystal and the support layer which is polycrystalline can be reduced by a high concentration impurity layer.

The semiconductor substrate manufactured by the method for manufacturing a semiconductor substrate includes the first thin film layer formed of single crystal of the first semiconductor material, the support layer formed on the first thin film layer and formed of SiC polycrystal, and the single crystal layer for device formation formed on the surface of the first thin film layer opposite to the support layer and formed of single crystal. The first semiconductor material is any one of SiC, GaN and gallium oxide, and the single crystal layer for device formation is formed of any one of SiC, GaN and gallium oxide. Therefore, it is possible to provide a support layer having an excellent toughness and an optimum thickness, and a high quality single crystal layer for device formation can be provided on the first thin film layer. In addition, since the thickness of the first thin film layer may be small, the semiconductor substrate of the present invention can be made less expensive than conventional semiconductor substrates using a single crystal SiC substrate as a support substrate. Since the support layer formed of SiC polycrystal serves as the support substrate, the impurity concentration can be made higher than that of the single crystal substrate, so that the resistance of the support substrate can be lowered. By virtue of the use of this semiconductor substrate, it is possible to form SiC elements, GaN elements, gallium oxide elements and the like which are thin and suitable for high power applications.

In addition, according to another semiconductor substrate manufactured by the method for manufacturing a semiconductor substrate, since a buffer layer formed of polycrystalline SiC or amorphous SiC is provided, a support layer having higher uniformity can be formed at high speed, and a low-cost semiconductor substrate with less warpage can be obtained.

DESCRIPTION OF EMBODIMENTS

Figure 1:
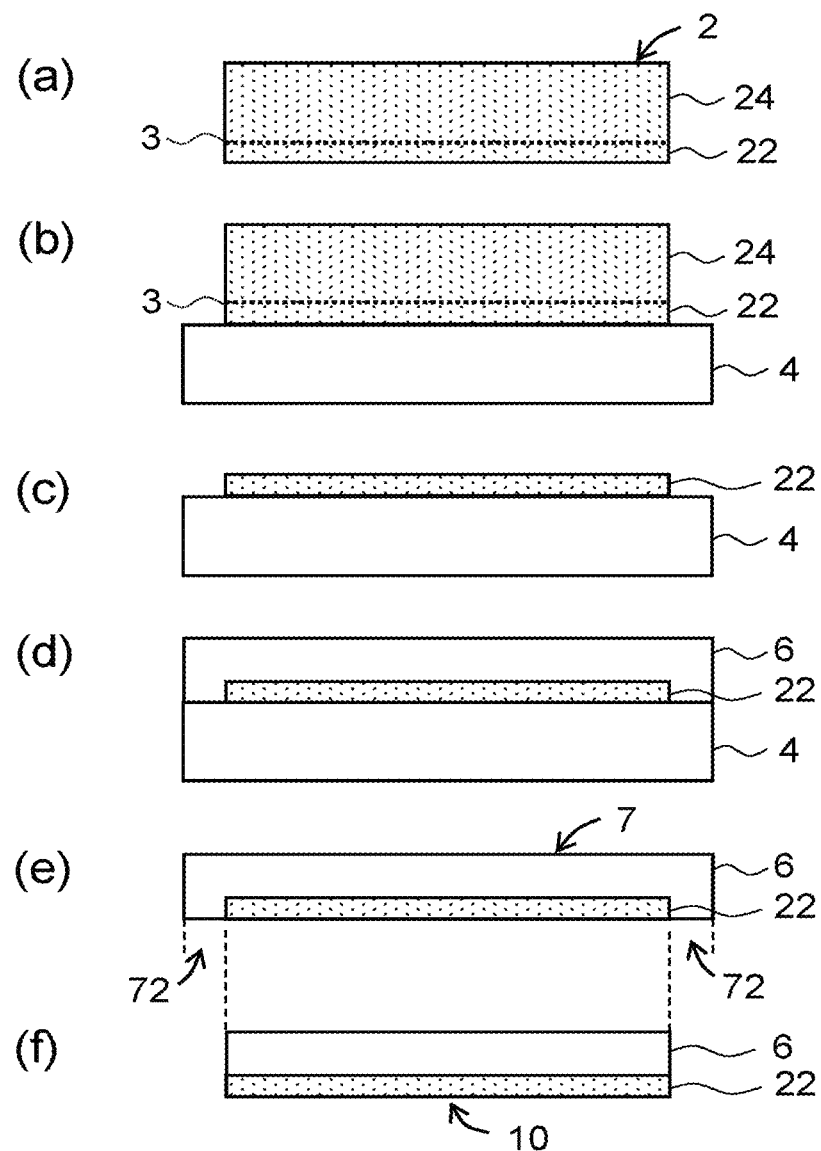
FIGS. 1(a) to 1(f) are cross-sectional views showing a method for manufacturing a semiconductor substrate.

FIGS. 1(a) to 1(f) are schematic cross-sectional views showing a process for manufacturing a semiconductor substrate according to one embodiment of the present invention, and a method for manufacturing the semiconductor substrate will be described with reference to FIGS. 1(a) to 1(f).

As shown in FIGS. 1(a) to 1(f), the present manufacturing process includes a hydrogen layer forming step (a) of implanting hydrogen ions at a predetermined depth from a surface of a first substrate 2 formed of single crystal of a first semiconductor material to form a hydrogen layer 3, a bonding step (b) of bonding the surface of the first substrate 2 and a temporary substrate 4, a first separation step (C) of separating the first substrate 2 bonded to the temporary substrate 4 with the hydrogen layer 3 as a boundary to leave the separated surface side of the first substrate 2 as a first thin film layer 22 on the temporary substrate 4, a support layer forming step (d) of forming a support layer 6 formed of a second semiconductor material on the temporary substrate 4 on which the first thin film layer 22 is left, a second separation step (e) of removing the temporary substrate 4 to obtain a second substrate 7 on which the first thin film layer 22 is stacked on the support layer 6, and a cutting step (f) of cutting a peripheral edge portion 72 in a predetermined range from an outer periphery of the second substrate 7.

(Hydrogen Layer Forming Step)

The first substrate 2 is formed of single crystal of the first semiconductor material and is a substrate with good crystallinity. The type of the first semiconductor material is not particularly limited, and examples thereof include SiC, GaN, and gallium oxide. As shown in FIG. 1(a), in the hydrogen layer forming step, hydrogen ions are implanted at a predetermined depth (for example, a depth of 0.5 µm) from one surface (the lower surface side in the drawing) of the first substrate 22, whereby the hydrogen layer 3 is formed. The surface side of the first substrate 2 divided by the hydrogen layer 3 is referred to as a thin film portion 22, and the opposite side is referred to as a base portion 24.

(Bonding Step)

As shown in FIG. 1(b), in the bonding step, the surface of the first substrate 2 on which the hydrogen layer 3 is formed, that is, the surface of the thin film portion 22 is bonded to the temporary substrate 4. The material of the temporary substrate 4 is not particularly limited, and at least one of a semiconductor (for example, polycrystalline SiC), carbon and metal can be used. Further, in order to facilitate bonding of the temporary substrate 4 and subsequent separation, a bonding layer (44) having a predetermined thickness may be provided on a surface layer portion of a bonding surface of the temporary substrate 4 with the first substrate 2 (See FIGS. 5(a) to 5(e)). There is no particular limitation on the method of bonding the first substrate 2 and the temporary substrate 4, and the first substrate 2 and the temporary substrate 4 can be bonded together by applying various methods (described later).

(First Separation Step)

Next, in the first separation step, the first substrate 2 bonded to the temporary substrate 4 in the bonding step is separated with the hydrogen layer 3 as a boundary in a high temperature state. Consequently, as shown in FIG. 1(c), the separated thin film portion 22 (hereinafter referred to as the first thin film layer 22) of the first substrate 2 is left on the temporary substrate 4. The separated base portion 24 of the first substrate 2 can be used again as the first substrate 2.

(Support Layer Forming Step)

After the first separation step, in the support layer forming step shown in FIG. 1(d), the support layer 6 formed of the second semiconductor material is formed on the entire surface of the temporary substrate 4 on which the first thin film layer 22 is left. The type of the second semiconductor material is not particularly limited, and examples thereof include SiC and GaN. Further, the crystallinity of the support layer 6 to be formed is not limited, and it may be single crystal or polycrystalline. Thus, it is also possible to grow the support layer 6 having a thickness of several hundreds μm at high speed.

(Second Separation Step)

After the support layer forming step, as shown in FIG. 1(e), the temporary substrate 4 is removed in the second separation step, whereby the second substrate 7 in which the first thin film layer 22 is stacked on the support layer 6 can be obtained. Through this step, the role of the substrate supporting the first thin film layer 22 of single crystal is played by the support layer 6. In FIG. 1(e), although the entirety of the temporary substrate 4 is removed, the temporary substrate 4 may be separated while leaving its surface layer portion. That is, in the second separation step, the temporary substrate 4 may be removed leaving the bonding layer (44) (see FIGS. 5(a) to 5(e)). In that case, the bonding layer (44) remains in contact with the first thin film layer 22 of the second substrate 7. This bonding layer (44) can be removed in the bonding layer removal step to be performed later.

(Cutting Step)

In the cutting step, the peripheral edge portion 72 in a predetermined range is cut from the outer periphery of the second substrate 7. Consequently, the semiconductor substrate can be completed. The region to be cut as the peripheral edge portion 72 can be appropriately set in relation to warpage of the semiconductor substrate occurring after removing the temporary substrate 4 (described later). FIG. 1(f) shows a state in which a portion beyond the outer periphery of the first thin film layer 22 (that is, the outer periphery of the first substrate 2 as a base material) is cut and removed as the peripheral edge portion 72.

Through the above steps, it is possible to obtain a semiconductor substrate 10 which includes the first thin film layer 22 provided on the support layer 6 and is formed by cutting the peripheral edge portion 72 in a predetermined range from the outer periphery of the second substrate 7.

Figure 2:
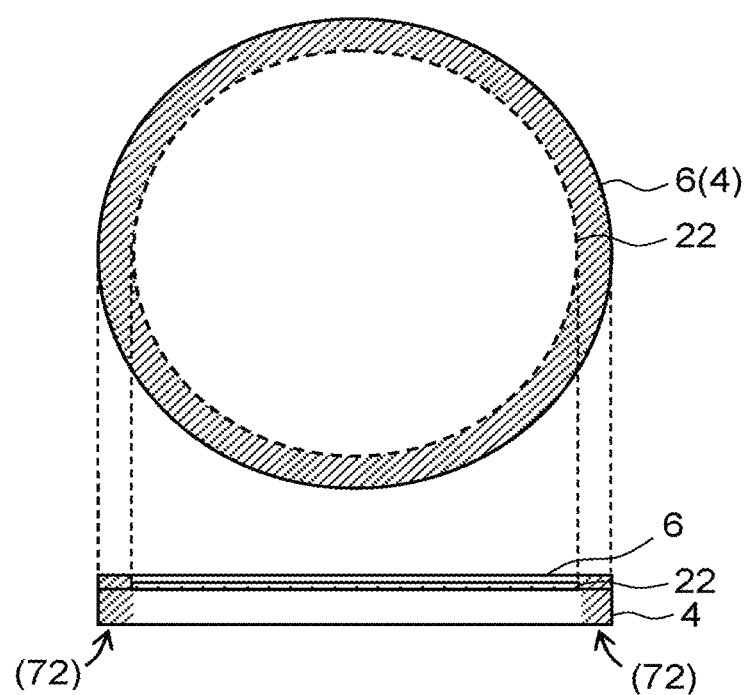
FIG. 2 is a top view and a cross-sectional view showing a state in which a single crystal thin film layer (first thin film layer) and a support layer irrespective of crystallinity are formed on a temporary substrate.

FIG. 2 shows a state in which the first thin film layer 22 formed of SiC single crystal and the support layer 6 irrespective of crystallinity are formed on the temporary substrate 4 through the support layer forming step. In this example, the diameter of the first thin film layer 22 is equal to the diameter (6 inches) of the disk-shaped first substrate 2 as the base material of the first thin film layer 22, and the thickness thereof is 0.5 μm. Further, the diameter of the support layer 6 is equal to the diameter (8 inches) of the disk-shaped temporary substrate 4 serving as a base of the support layer 6, and the thickness thereof is 300 μm. The thickness of the temporary substrate 4 is approximately 2 to 10 mm. In FIG. 2, the peripheral edge portion 72 to be removed in the cutting step is indicated by oblique lines.

Figure 3:
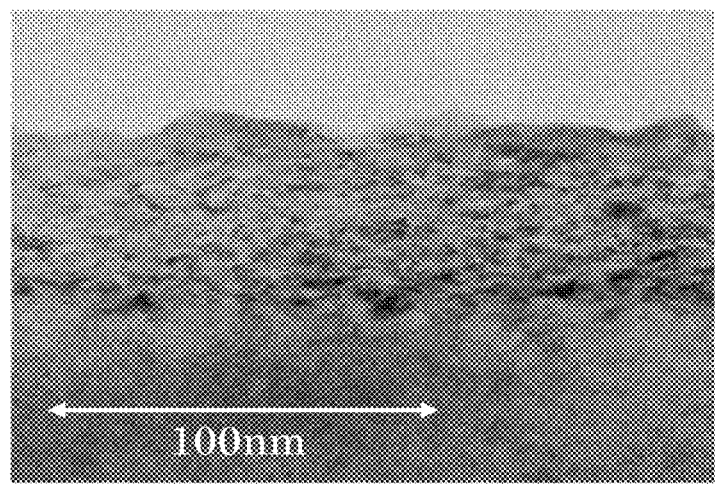
FIG. 3 is a transmission electron microscope (TEM) image of a cleavage plane of a SiC single crystal thin film layer (first thin film layer) separated by a hydrogen layer.

The first thin film layer 22 is formed by cleaving the first substrate 2 with the hydrogen layer 3 through the first separation step. FIG. 3 is a transmission electron microscope (TEM) image of the cleavage plane of the first thin film layer 22 formed of SiC single crystal shown in the preceding figure. In this way, irregularities of several tens nm are seen in the thickness direction on the cleavage plane of the first thin film layer 22. If necessary, the irregularities may be polished to a surface roughness of approximately Ra 1 nm.

(Bonding Layer Removal Step)

In order to planarize the surface of the first thin film layer 22, the present method for manufacturing a semiconductor substrate can include the bonding layer removal step. In the bonding layer removal step, the first thin film layer 22 is polished or the like so as to have a required surface roughness. Any polishing method can be used, and, for example, chemical mechanical polishing (CMP) can be performed.

The cutting step and the bonding layer removal step may be performed in any order. That is, the peripheral edge portion 72 may be removed after polishing the surface of the first thin film layer 22 of the second substrate 7, or the surface of the first thin film layer 22 may be polished after removing the peripheral edge portion 72.

Figure 5:
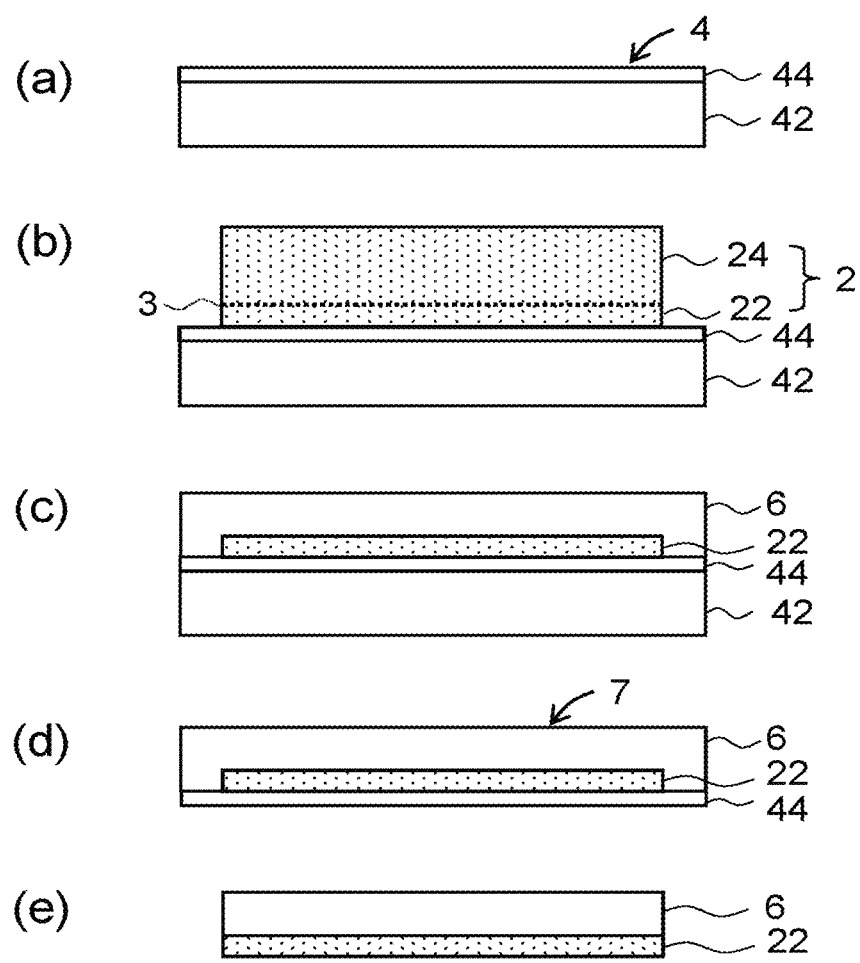
FIGS. 5(a) to 5(e) are cross-sectional views showing a method for manufacturing a semiconductor substrate using the temporary substrate on which a bonding layer is formed.

As described above, when the temporary substrate 4 is removed leaving the bonding layer (44) in the second separation step, the bonding layer (44) is stacked on the first thin film layer 22 of the second substrate 7 (see FIG. 5(d)). This bonding layer (44) can be removed in the bonding layer removal step. Consequently, a bonding interface layer between the first thin film layer 22 and the temporary substrate 4 bonded in the bonding step is completely removed, and the surface of the first thin film layer 22 with good crystallinity appears on the surface.

In the present semiconductor substrate, in order to form the homogeneous support layer 6, the semiconductor substrate can be configured such that a buffer layer is provided between the first thin film layer 22 and the support layer 6.

(Buffer Layer Forming Step)

Figure 4:
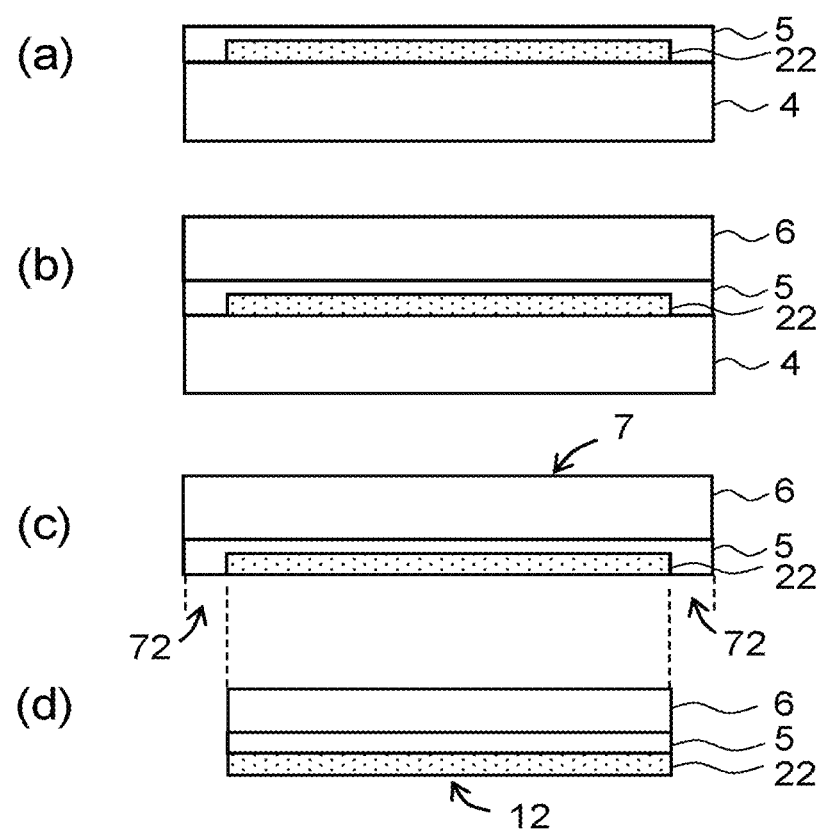
FIGS. 4(a) to 4(d) are cross-sectional views showing a method for manufacturing a semiconductor substrate in which the support layer is provided on a buffer layer.

FIG. 4(a) shows the buffer layer forming step of forming a buffer layer 5 formed of a third semiconductor material on the temporary substrate 4 on the side where the first thin film layer 22 is left in the first separation step. The type of the third semiconductor material is not particularly limited, and SiC may be used, for example. The crystallinity of the buffer layer 5 is not limited, and the buffer layer 5 can be formed as a polycrystalline or amorphous layer.

In a region where the first thin film layer 22 exists on the temporary substrate 4, the buffer layer 5 rises substantially by the thickness of the first thin film layer 22. Although the subsequent step may be performed as it is, a surface of the buffer layer 5 may be planarized by CMP or the like, if necessary.

When the buffer layer 5 is formed, the surface of the first thin film layer 22 and the surface of the surrounding temporary substrate 4 are roughly polished, so that a surface on which a semiconductor layer (for example, SiC polycrystal) to be the buffer layer 5 is likely to grow can be formed.

After the buffer layer forming step, the support layer forming step, the second separation step, the cutting step and the bonding layer removal step similar to those described above can be performed. In the support layer forming step, as shown in FIG. 4(b), the support layer 6 is formed on the buffer layer 5. When the buffer layer 5 is not provided, the crystallinity of the support layer 6 grown in a region where the first thin film layer 22 exists on the temporary substrate 4 is different from that in a region where the first thin film layer 22 does not exist, that is, a region where the temporary substrate 4 in the peripheral edge portion is exposed. By virtue of the provision of the buffer layer 5, the more homogeneous support layer 6 can be grown on the buffer layer 5.

As shown in FIG. 4(c), the second substrate 7 after removing the temporary substrate 4 in the second separation step has a structure in which the buffer layer 5 and the first thin film layer 22 are sequentially stacked on the support layer 6.

FIG. 4(d) shows a state in which the peripheral edge portion 72 in a predetermined range is cut from the outer periphery of the second substrate 7 through the cutting step. The present method can further include the bonding layer removal step of planarizing the surface of the first thin film layer 22 with good crystallinity.

Through the above steps, it is possible to obtain a semiconductor substrate 12 which includes the buffer layer 5 and the first thin film layer 22 provided on the support layer 6 and is formed by removing the peripheral edge portion 72 in a predetermined range from the outer periphery of the second substrate 7.

It is known that a potential barrier is formed at the interface between a single crystal and a polycrystal due to a difference in bandgap (refer to Non Patent Literatures 1 and 3, etc.). For this potential barrier, theoretically, it is possible to eliminate interface resistance by forming a high concentration impurity layer at the interface and inducing a tunnel phenomenon.

(Impurity Introducing Step)

For example, when the first thin film layer 22 is formed of SiC single crystal and the support layer 6 is formed of SiC polycrystal, in the support layer forming step shown in FIG. 1(d), a high-concentration N-type layer may be formed at the interface between the first thin film layer 22 and the support layer 6. Further, in the support layer forming step shown in FIG. 4(b), nitrogen is ion-implanted into a surface layer of the first thin film layer 22 before forming the support layer 6, whereby a high concentration N-type layer may be formed. The high concentration N-type layer can also be formed by incorporating nitrogen into the surface layer in a nitrogen atmosphere before forming the support layer 6. Moreover, after forming the support layer 6 (FIG. 1(e) or FIG. 4(c)), the surface on the first thin film layer 22 side is planarized by CMP or the like, and then, nitrogen is added to the interface between the first thin film layer 22 of single crystal and the support layer 6 by ion implantation, whereby the high concentration N-type layer may be formed.

As described above, the element used for forming the high concentration N-type layer is not limited to nitrogen, and a wide range of elements can be used, as long as they become N-type, such as phosphorus.

The material and configuration of the temporary substrate 4 are not limited as long as the temporary substrate 4 can be bonded in the bonding step and can be removed in the second separation step. It is preferable that the bonding and removal of the temporary substrate 4 are easily performed and, in addition, it is preferable that the removed portion can be reused.

Thus, as shown in FIG. 5(a), the bonding layer 44 can be formed on the surface of the temporary substrate 4 to be bonded to the first substrate 2. The temporary substrate 4 is constituted of a main body portion 42 and the bonding layer 44. In the bonding step, as shown in FIG. 5(b), a surface of the bonding layer 44 and the first substrate 2 (the first thin film layer 22) are bonded to each other. Through the subsequent first separation step, the base portion 24 of the first substrate 2 is separated leaving the first thin film layer 22 on the bonding layer 44. Then, the support layer 6 is formed on the first thin film layer 22 through the support layer forming step (FIG. 5(c)). The buffer layer 5 may be provided on the first thin film layer 22, and the support layer 6 may be formed on the buffer layer 5. Thereafter, in the second separation step, the main body portion 42 of the temporary substrate 4 can be removed leaving the bonding layer 44 (FIG. 5(d)). Consequently, although the bonding layer 44 remains on the second substrate 7, the bonding layer 44 can be finally removed by the bonding layer removal step (FIG. 5(e)).

Figure 6:
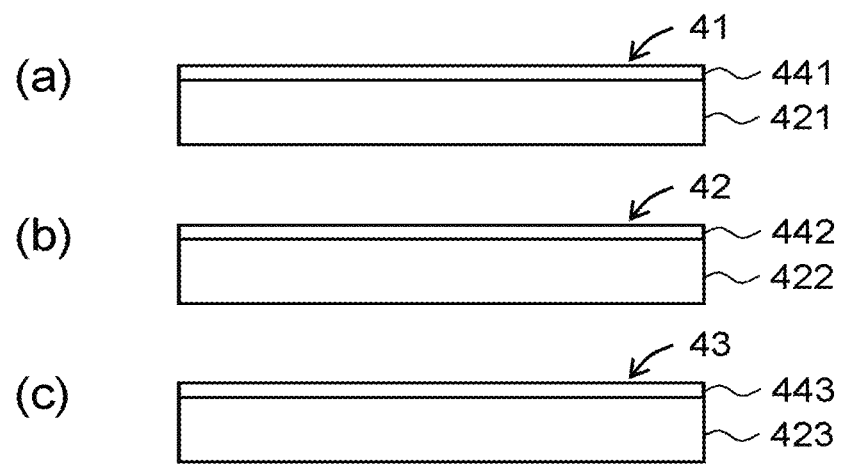
FIGS. 6(a) to 6(c) are cross-sectional views showing a configuration example of the temporary substrate on which the bonding layer is formed.

FIGS. 6(a) to 6(c) show an example of the temporary substrate 4 provided with a bonding layer. FIG. 6(a) shows an example in which a carbon substrate 421 having a thickness of about 10 mm (which may be approximately 2 mm) is used as a main body portion of a temporary substrate 41, and a SiC polycrystalline layer 441 having a thickness of about 1 μm is formed as a bonding layer. In this case, in the bonding step, a surface of the SiC polycrystalline layer 441 and a surface of the first substrate 2 formed of SiC single crystal are bonded to each other. Such SiC layers can be bonded together after both surfaces are activated by a FAB (Fast Atomic Beam) gun or ion beam. When the FAB gun is used, both surfaces are amorphized and bonded together, and an amorphous layer or a layer in which amorphous is recrystallized remains at the interface (refer to Patent Literature 2 and Non Patent Literature 1). When the ion beam is used, metal acts as a glue to bond both surfaces, and this metal remains at the interface. Since layers existing at the bonding interface can be removed by the bonding layer removal step, there is no problem on a final semiconductor substrate. Moreover, separation of the temporary substrate 4 in the second separation step is easily performed by, for example, incineration of the carbon substrate 421. The carbon substrate 421 can be separated mechanically or by thermal stress.

FIG. 6(b) shows an example in which a SiC substrate 422 having a thickness of about 1 mm is used as a main body portion of a temporary substrate 42, and a silicon oxide film 442 having a thickness of about 2 μm is formed as a bonding layer. The silicon oxide film 442 is formed on a surface of the SiC substrate 422 by CVD growth (chemical vapor deposition) or sputtering, and its surface roughness is about the same as the surface roughness (Ra: approximately 1 nm) of the SiC substrate 422. In this case, in the bonding step, a surface of the silicon oxide film 442 and a surface of the first substrate 2 formed of SiC single crystal are bonded to each other. This bonding is easily achieved by interposing water at room temperature due to the effect of hydroxy groups. In the support layer forming step, in order to form the support layer 6, first, at a relatively low temperature of 1200 to 1300° C. which is a temperature at which the silicon oxide film 442 is not softened, a SiC layer is vapor-phase-grown on the first thin film layer 22 so as to have a thickness of approximately 10 μm. In the vapor phase growth of SiC, it is known that approximately 1200° C. is a reaction rate-determining region, and the film forming rate is not fast. However, since the first thin film layer 22 serving as a base is a very thin SiC layer of approximately 0.5 μm, initially it is necessary to grow SiC below the temperature at which softening of the silicon oxide film 442 begins. Thereafter, the temperature is raised to approximately 1500° C., and the support layer 6 formed of SiC can be grown at high speed. Although the silicon oxide film 442 is softened at a temperature of approximately 1500° C., the SiC layer can be grown at high speed with the SiC layer of initially approximately 10 μm as the base. The separation of the temporary substrate 4 in the second separation step can be performed by removing the silicon oxide film 442 with hydrofluoric acid or the like.

FIG. 6(c) shows an example in which a transparent substrate 423 of sapphire or the like having a thickness of about 1 mm is used as a main body portion of a temporary substrate, and a gallium nitride (GaN) thin film 443 having a thickness of about 100 nm is formed as a bonding layer. A surface of the transparent substrate 423 and a surface of the GaN thin film 443 are subjected to planarization treatment (Ra: 1 nm). In this case, in the bonding step, a surface of the GaN thin film 443 and the surface of the first substrate 2 formed of SiC single crystal are bonded to each other. Both of them can be bonded together after activation of both surfaces by a FAB gun or ion beam as described above. The separation of the temporary substrate 4 in the second separation step is easily achieved by a method (laser lift-off technique) of irradiating a laser beam from the transparent substrate 423 side and melting and depositing Ga in the GaN thin film 443.

As the transparent substrate 423, it is also possible to use a SiC substrate having the same thermal expansion coefficient as that of the first thin film layer 22. Since the SiC substrate has transparency, it can be lifted off by laser beams.

It is possible to further facilitate bonding between the first substrate 2 and the temporary substrate 4.

FIGS. 7(a) to 7(g) show a process of previously forming a hydroxy group thin film on the surface of the first substrate 2; forming a hydroxy group thin film on the surface of the temporary substrate 4 bonded to the first substrate 2; in the bonding step, bonding the surface of the first substrate 2 on which the hydroxy group thin film is formed and the surface of the temporary substrate 4 on which the hydroxy group thin film is formed; and manufacturing a semiconductor substrate.

As shown in FIG. 7(a), on one surface (the lower surface side in the drawing) of the first substrate 2 formed of single crystal of a first semiconductor material (for example, SiC), a Si thin film 25 is formed as a hydroxy group thin film. In the hydrogen layer forming step, hydrogen ions are implanted at a predetermined depth (for example, a depth of 0.5 μm) from the above-described one surface of the first substrate 2, whereby the hydrogen layer 3 is formed. The surface side of the first substrate 2 divided by the hydrogen layer 3 is referred to as a thin film portion 22, and the opposite side is referred to as a base portion 24. Further, the entirety including the Si thin film 25 formed on a surface layer is referred to as the first substrate 2.

On the other hand, as shown in FIG. 7(b), a $SiO_2$ thin film 45 as a hydroxy group thin film is formed on a surface of the temporary substrate 4 formed of carbon, which is bonded to the first substrate 2. That is, in this example, the temporary substrate 4 is constituted of a carbon substrate 42 and the $SiO_2$ thin film 45. In the bonding step, as shown in FIG. 7(c), the $SiO_2$ thin film 45 of a surface layer of the temporary substrate 4 and the Si thin film 25 of a surface layer of the first substrate 2 are bonded to each other.

Through the subsequent first separation step, the base portion 24 of the first substrate 2 is separated leaving the thin film portion (first thin film layer) 22 bonded onto the temporary substrate 4 via the Si thin film 25 (FIG. 7(d)). Then, the support layer 6 is formed on the first thin film layer 22 through the support layer forming step (FIG. 7(e)). As the support layer 6, a SiC layer (irrespective of crystallinity) can be formed by, for example, thermal CVD. Since the support layer 6 is formed on the temporary substrate 4 which is larger than the diameter of the first thin film layer 22, the support layer 6 is formed so as to cover not only an upper surface but also a side surface portion of the first thin film layer 22. The buffer layer 5 may be provided on the first thin film layer 22, and the support layer 6 may be formed on the buffer layer 5. Thereafter, in the second separation step, the temporary substrate 4 can be removed (FIG. 7(f)). The carbon substrate 42 constituting the temporary substrate 4 can be removed by incineration, and the $SiO_2$ thin film 45 can be removed by etching.

Thus, the second substrate 7 on which the Si thin film 25, the first thin film layer 22, and the support layer 6 are stacked is obtained. FIG. 7(g) shows a state in which the peripheral edge portion 72 exceeding the diameter of the first thin film layer 22 is cut from the outer periphery of the second substrate 7 by the cutting step, and the remaining Si thin film 25 is removed by etching. Further, if necessary, if the surface of the first thin film layer 22 is planarized by CMP (chemical mechanical polishing), a high-quality single crystal layer (for example, SiC single crystal layer) for forming a semiconductor device on the first thin film layer 22 can be epitaxially grown or the like. In the state shown in FIG. 7(a), if the surface of the thin film portion (first thin film layer) 22 is polished by CMP before forming the Si thin film 25, a single crystal layer can be epitaxially grown as it is without polishing after removal of the Si thin film 25.

In the above example, one surface of the first substrate 2 formed of single crystal has a surface roughness Ra of approximately 0.1 nm, and the Si thin film 25 can be formed thereon. The Si thin film 25 is formed of polycrystalline Si and can be formed to have a thickness of approximately 50 nm by, for example, a plasma CVD method. The thickness of the carbon substrate constituting the temporary substrate 4 may be approximately 2 mm, and the thickness of the $SiO_2$ thin film 45 may be approximately 1 μm. A surface layer of the carbon substrate is porous and has the surface roughness Ra of approximately 1 mm; however, the polycrystalline $SiO_2$ thin film 45 is formed on the surface thereof by CVD to have a thickness of approximately 3 μm, then polished to a thickness of approximately 1 μm by CMP, and thereby can be flattened to approximately Ra 0.1 nm. The $SiO_2$ thin film 45 of the surface layer of the temporary substrate 4 and the Si thin film 25 of the surface layer of the first substrate 2 are bonded by hydroxy groups at the interface between $SiO_2$ and Si. Specifically, if the flatness of the surfaces of the Si thin film 25 and the $SiO_2$ thin film 45 is approximately Ra 0.1 nm, the Si thin film 25 and the $SiO_2$ thin film 45 can be easily bonded at room temperature with interposition of water.

FIGS. 8(a) to 8(g) show a process in which a hydroxy group thin film is previously formed on the surface of the first substrate 2, a Si substrate is used as the temporary substrate 4, in the bonding step the surface of the first substrate 2 on which the hydroxy group thin film is formed and the surface of the temporary substrate 4 are bonded to each other, and a semiconductor substrate is manufactured.

As shown in FIG. 8(a), on one surface (the lower surface side in the drawing) of the first substrate 2 formed of single crystal of a first semiconductor material (for example, SiC), a $SiO_2$ thin film 26 is formed as a hydroxy group thin film. In the hydrogen layer forming step, hydrogen ions are implanted at a predetermined depth (for example, a depth of 0.5 μm) from the above-described one surface of the first substrate 2, whereby the hydrogen layer 3 is formed. The surface side of the first substrate 2 divided by the hydrogen layer 3 is referred to as a thin film portion 22, and the opposite side is referred to as a base portion 24. Further, the entirety including the $SiO_2$ thin film 26 formed on a surface layer is referred to as the first substrate 2.

On the other hand, the temporary substrate 4 shown in FIG. 8(b) is a Si substrate. In the bonding step, as shown in FIG. 8(c), the temporary substrate 4 and the $SiO_2$ thin film 26 of a surface layer of the first substrate 2 are bonded to each other. This bonding is performed by hydroxy groups at the interface between SiO$_2$ and Si. Specifically, if the flatness of the surfaces of the Si thin film 25 and the SiO$_2$ thin film layer 45 is approximately Ra 0.1 nm, the Si thin film 25 and the SiO$_2$ thin film layer 45 can be easily bonded with interposition of water.

Figure 8:
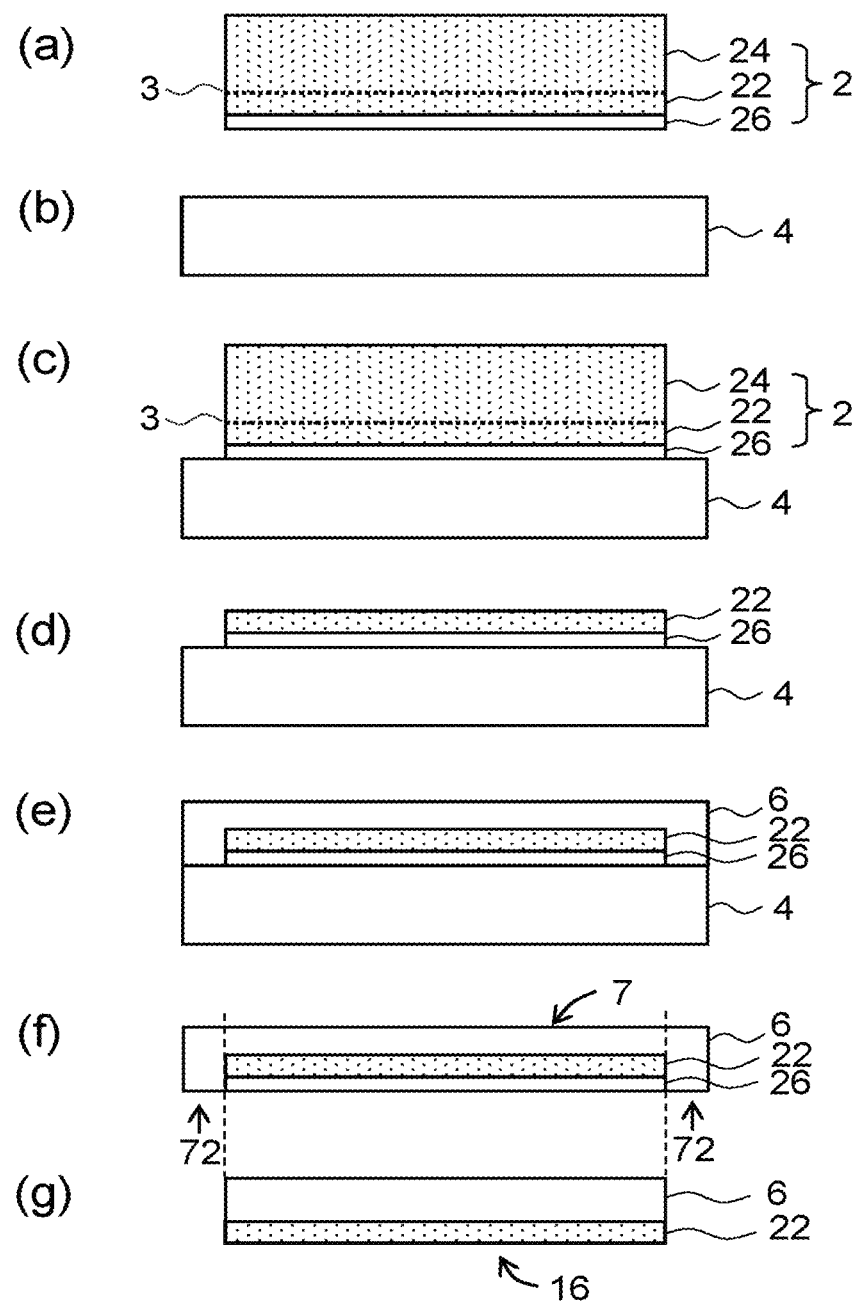
FIGS. 8(a) to 8(g) are cross-sectional views showing a method for manufacturing a semiconductor substrate using the first substrate on which the bonding layer is formed.

Through the subsequent first separation step, the base portion 24 of the first substrate 2 is separated leaving the thin film portion (first thin film layer) 22 bonded onto the temporary substrate 4 via the SiO$_2$ thin film 26 (FIG. 8(*d*)). Then, the support layer 6 is formed on the first thin film layer 22 through the support layer forming step (FIG. 8(*e*)). As the support layer 6, a SiC layer (irrespective of crystallinity) can be formed by, for example, thermal CVD. Since the support layer 6 is formed on the temporary substrate 4 which is larger than the diameter of the first thin film layer 22, the support layer 6 is formed so as to cover not only an upper surface but also a side surface portion of the first thin film layer 22. The buffer layer 5 may be provided on the first thin film layer 22, and the support layer 6 may be formed on the buffer layer 5. Thereafter, in the second separation step, the temporary substrate 4 can be removed (FIG. 8(*f*)). Since the temporary substrate 4 is a Si substrate, the temporary substrate 4 can be thinned by polishing, for example, and then removed by etching.

Thus, the second substrate 7 on which the SiO$_2$ thin film 26, the first thin film layer 22, and the support layer 6 are stacked is obtained. FIG. 8(*g*) shows a state in which the peripheral edge portion 72 exceeding the diameter of the first thin film layer 22 is cut from the outer periphery of the second substrate 7 by the cutting step, and the remaining SiO$_2$ thin film 26 is removed by etching. Thereafter, if the surface of the first thin film layer 22 is planarized by CMP as necessary, a high-quality single crystal layer (for example, SiC single crystal layer) for forming a semiconductor device on the first thin film layer 22 can be epitaxially grown or the like.

Figure 9:
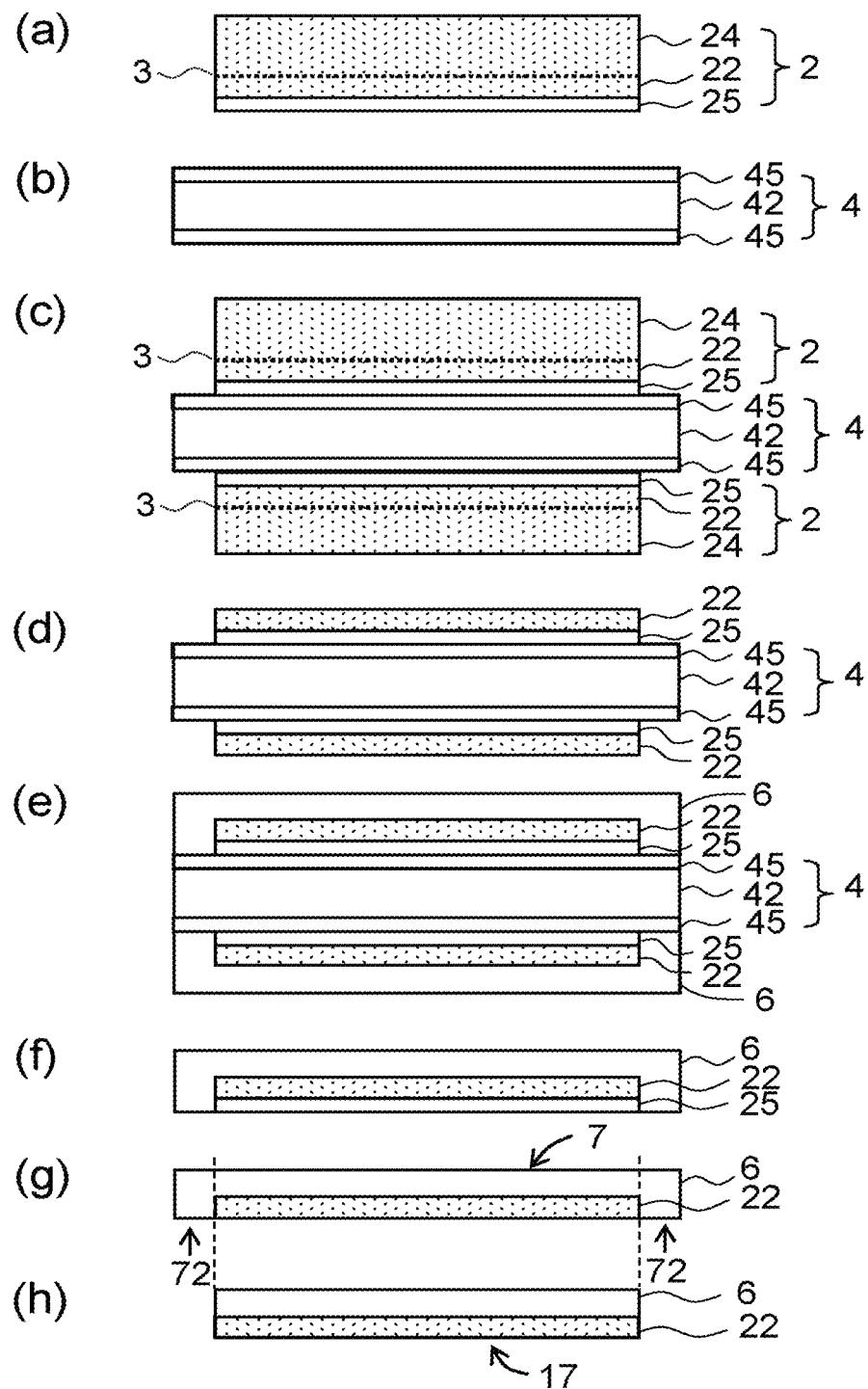
FIGS. 9(a) to 9(h) are cross-sectional views showing a method for manufacturing a semiconductor substrate in which a first thin film layer and the support layer are formed on both surfaces of the temporary substrate, respectively.

FIGS. 9(*a*) to 9(*h*) show a modification of the manufacturing method shown in FIGS. 7(*a*) to 7(*g*), and only points different from the manufacturing method of FIGS. 7(*a*) to 7(*g*) will be described. As shown in FIG. 9(*b*), the SiO$_2$ thin film 45 as hydroxy group thin films are formed on both upper and lower surfaces of the temporary substrate 4 formed of carbon. That is, in this example, the temporary substrate 4 is constituted of the carbon substrate 42 and the SiO$_2$ thin films 45 formed on the both surfaces of the carbon substrate 42. In the bonding step, as shown in FIG. 9(*c*), the SiO$_2$ thin films 45 of both surface layers of the temporary substrate 4 and the Si thin films 25 of surface layers of the two first substrates 2 are bonded to each other.

Through the subsequent first separation step, the base portions 24 of the two first substrates 2 are separated leaving the thin film portions (first thin film layers) 22 bonded onto the both surfaces of the temporary substrate 4 via the respective Si thin films 25 (FIG. 9(*d*)). Then, the support layers 6 are formed on the first thin film layers 22 left on the respective surfaces of the temporary substrate 4 through the support layer forming step (FIG. 9(*e*)). Thereafter, in the second separation step, the temporary substrate 4 is removed. FIG. 9(*f*) shows the substrate on one surface side from which the temporary substrate 4 has been removed. By virtue of this manufacturing method, as shown in FIG. 9(*g*), the second substrate 7 in which the first thin film layer 22 and the support layer 6 are stacked can be obtained from each surface of the temporary substrate 4.

Figure 10:
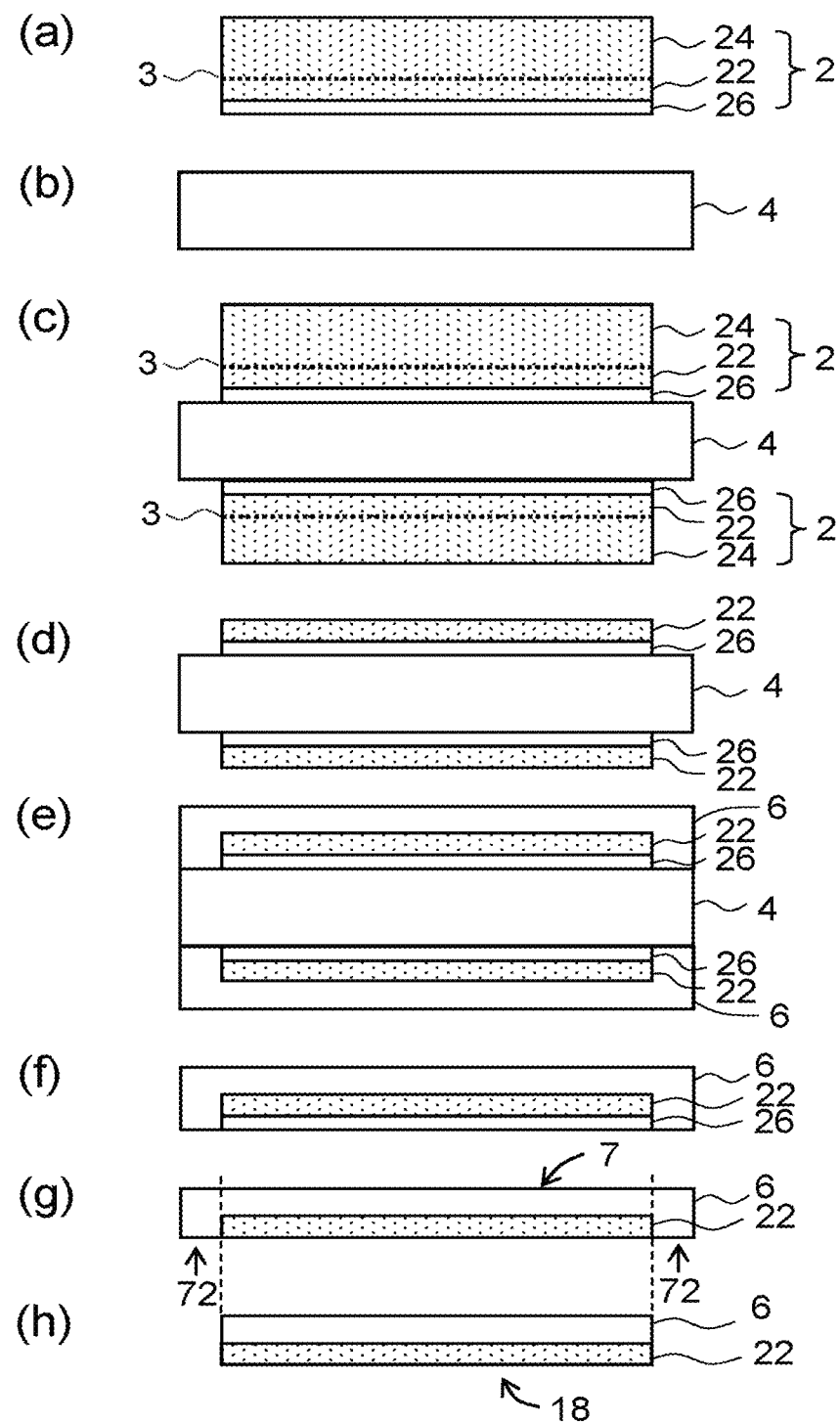
FIGS. 10(a) to 10(h) are cross-sectional views showing a method for manufacturing a semiconductor substrate in which the first thin film layer and the support layer are formed on both surfaces of another temporary substrate, respectively.

FIGS. 10(*a*) to 10(*h*) show a modification of the manufacturing method shown in FIGS. 8(*a*) to 8(*g*), and only points different from the manufacturing method of FIGS. 8(*a*) to 8(*g*) will be described. As shown in FIG. 10(*a*), on one surface (the lower surface side in the drawing) of the first substrate 2 formed of single crystal of a first semiconductor material (for example, SiC), a SiO$_2$ thin film 26 is formed as a hydroxy group thin film. The entirety including the SiO$_2$ thin film 26 formed on a surface layer is referred to as the first substrate 2. On the other hand, the temporary substrate 4 shown in FIG. 10(*b*) is a Si substrate. In the bonding step, as shown in FIG. 10(*c*), the temporary substrate 4 and the SiO$_2$ thin films 26 of surface layers of the two first substrates 2 are bonded to each other. This bonding is performed by hydroxy groups at the interface between SiO$_2$ and a Si layer of a Si substrate surface layer.

Through the subsequent first separation step, the base portions 24 of the two first substrates 2 are separated leaving the thin film portions (first thin film layers) 22 bonded onto the both surfaces of the temporary substrate 4 via the respective SiO$_2$ thin films 26 (FIG. 10(*d*)). Then, the support layers 6 are formed on the first thin film layers 22 left on the respective surfaces of the temporary substrate 4 through the support layer forming step (FIG. 10(*e*)). Thereafter, in the second separation step, the temporary substrate 4 is removed. The temporary substrate (Si substrate) 4 is cut at the center in parallel with the above-described both surfaces, for example, and the respective cut portions are thinned and then etched, whereby the temporary substrate 4 can be removed. FIG. 10(*f*) shows the substrate on one surface side from which the temporary substrate 4 has been removed.

By virtue of this manufacturing method, as shown in FIG. 10(*g*), the second substrate 7 in which the first thin film layer 22 and the support layer 6 are stacked can be obtained from each surface of the temporary substrate 4.

Figure 7:
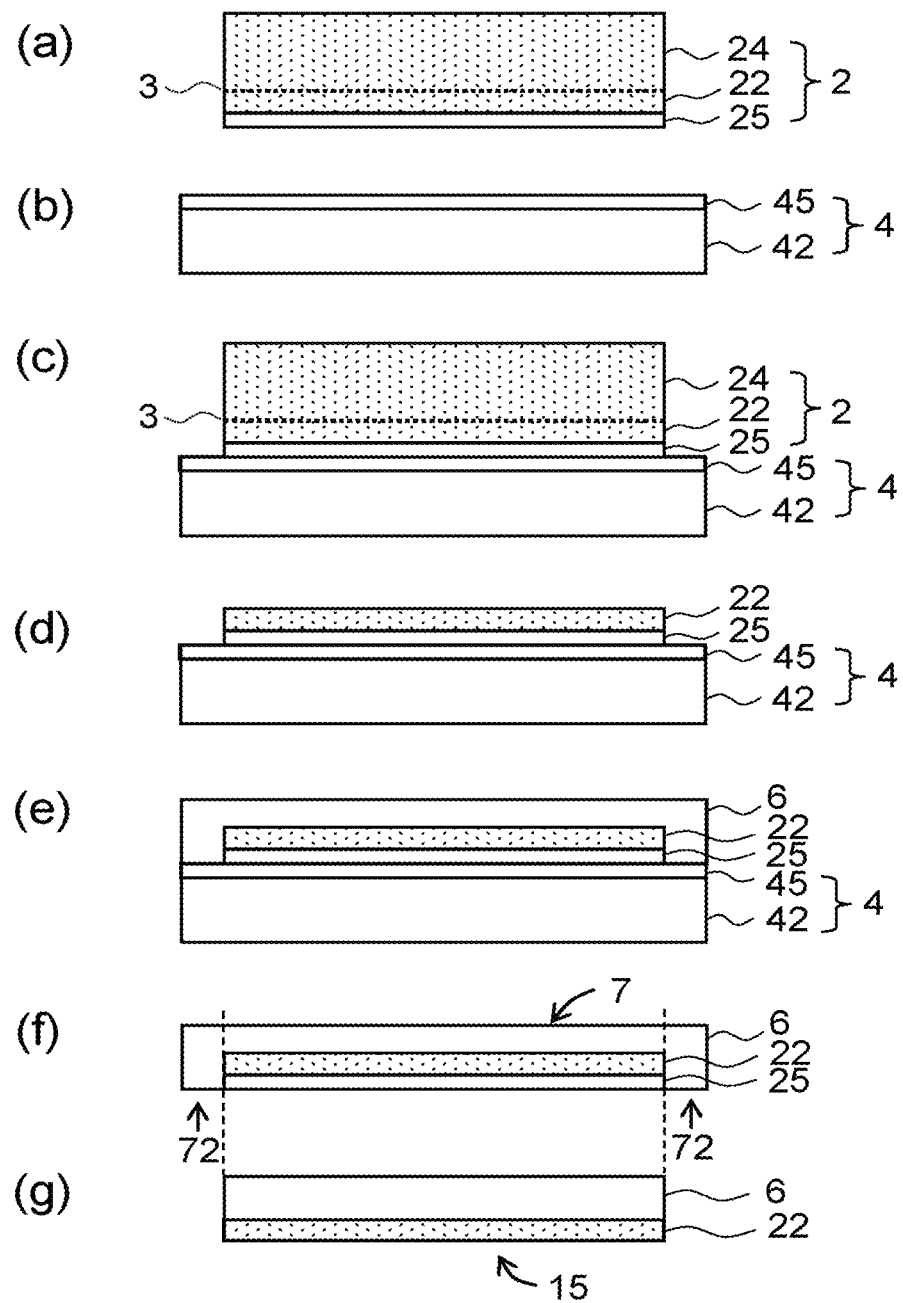
FIGS. 7(a) to 7(g) are cross-sectional views showing a method for manufacturing a semiconductor substrate using a first substrate and the temporary substrate, each of which has the bonding layer formed thereon.

In the manufacturing method shown in FIGS. 7(*a*) to 7(*g*) and 9(*a*) to 9(*h*), the Si thin film 25 is formed on the surface layer of the first substrate 2 for bonding with the temporary substrate 4. In the support layer forming step, the support layer 6 formed of SiC irrespective of crystallinity can be grown by the thermal CVD method. In general, in order to form a SiC film by thermal CVD, a high temperature of 1300° C. or higher is required, and when growing a film having a high nitrogen concentration or growing the SiC film at high speed, a high temperature of approximately 1500° C. is required. When the support layer 6 is formed at a temperature exceeding the melting point of Si of 1420° C., the thickness of the Si thin film 25 needs to be as small as possible. For example, the SiO$_2$ thin film 45, the Si thin film 25 and the first thin film layer 22 are stacked on the carbon substrate, and Si is melted in the process of growing the thick support layer 6 formed of SiC thereon; therefore, the Si thin film 25 is preferably thin, and specifically, the thickness of the Si thin film 25 is preferably smaller than the thickness of the first thin film layer 22. In the example described with reference to FIGS. 7(*a*) to 7(*g*) and 9(*a*) to 9(*h*), the Si thin film 25 has a thickness of 0.05 µm, and the first thin film layer 22 has a thickness of 0.5 µm, so that the conditions are satisfied.

In the manufacturing method shown in FIGS. 7(*a*) to 7(*g*) and 9(*a*) to 9(*h*), it is also possible to replace the Si thin film 25 and the SiO$_2$ thin film 45 to form the SiO$_2$ thin film 25 and the Si thin film 45. However, in the case where the Si thin film 45 is formed on the carbon substrate and the support layer 6 formed of SiC is formed at a high temperature exceeding the melting point of Si, it is preferable to reduce the thickness of the Si thin film 45.

(Single Crystal Layer Forming Step)

Figure 14:
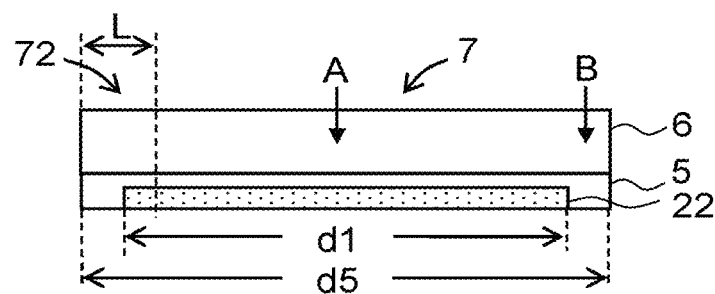
FIG. 14 is a cross-sectional view showing a configuration of a semiconductor substrate.

When the semiconductor substrates (10, 12, 14, 15, 16, 17, and 18) manufactured by the manufacturing method as described above become support substrates for a semiconductor device (for example, the element support substrate 110 shown in FIG. 14). By forming a single crystal layer having a required thickness (5 to 10 μm) and a required N type concentration on a semiconductor substrate (10, 12, etc.), a substrate for forming a power device can be obtained.

For this purpose, a single crystal layer (single crystal layer for device formation) (8) to be an active layer of a semiconductor device is formed based on a semiconductor substrate (10, 12, etc.). The single crystal layer forming step is a process of forming through epitaxial growth the single crystal layer (8), formed of the first semiconductor material, on the first thin film layer 22 formed on the support layer 6 of the semiconductor substrate (10, 12, etc.) and formed of single crystal of the first semiconductor material. The buffer layer 5 may be provided between the support layer 6 and the first thin film layer 22.

Figure 11:
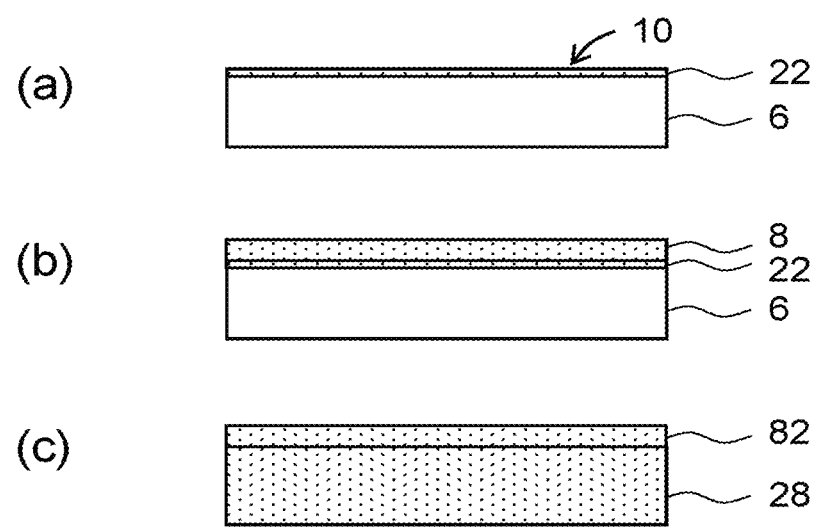
FIGS. 11(a) to 11(c) are cross-sectional views showing a manufacturing process for forming a single crystal layer for device formation to be an active layer of a semiconductor device.
Figure 18:
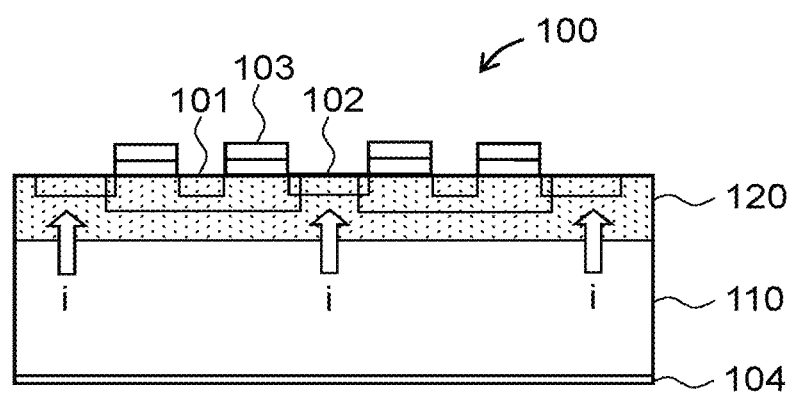
FIG. 18 is a schematic cross-sectional view of a semiconductor device (MOSFET) having a general vertical structure.

For example, in the semiconductor substrate 10 shown in FIG. 11(*a*), the first thin film layer 22 formed of SiC single crystal is formed on the support layer 6 formed of SiC irrespective of crystallinity. On the first thin film layer 22, as shown in FIG. 11(*b*), the SiC single crystal layer 8 having a thickness of about 10 μm is formed by epitaxial growth. Since the SiC single crystal layer 8 is formed on the first thin film layer 22 formed of SiC single crystal, the SiC single crystal layer 8 inherits the crystallinity of the first thin film layer 22 serving as a base and becomes a single crystal having good crystallinity. Then, using this SiC single crystal layer 8 as an active layer, a semiconductor device as shown in FIG. 18 can be formed.

FIG. 11(*c*) shows a conventional structure example in which a SiC single crystal layer 82 to be an active layer is formed on a thick SiC single crystal substrate 28 by epitaxial growth. The crystallinity of the SiC single crystal layer 82 inherits the crystal quality of the SiC single crystal substrate 28 serving as a base, and when the SiC single crystal substrate 28 has a diameter of 6 inches, the thickness is generally approximately 300 μm. The thickness of the SiC single crystal layer (first thin film layer 22) used in the manufacturing method of the present invention is approximately 0.5 to 1 μm, which is much thinner than the conventional SiC single crystal substrate 28.

Figure 12:
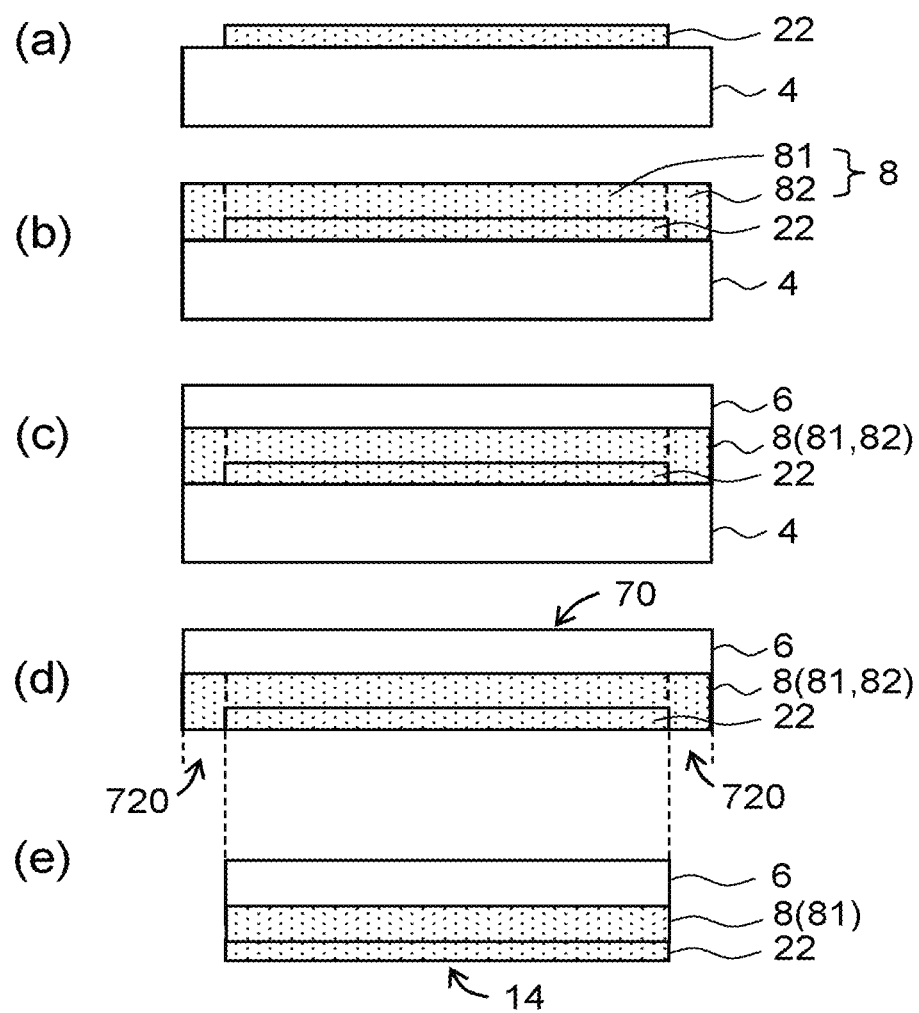
FIGS. 12(a) to 12(e) are cross-sectional views showing a manufacturing method for forming the single crystal layer for device formation, which is to be an active layer of a semiconductor device, and then providing the support layer.

In the manufacturing method of the present invention, a single crystal layer forming step of forming the single crystal layer (single crystal layer for device formation) 8 to be an active layer of a semiconductor device is provided, and the single crystal layer 8 may be formed before the support layer 6 and the buffer layer 5 are provided. In that case, in the single crystal layer forming step, first, as shown in FIG. 12(*a*), in a state in which the first thin film layer 22 formed of single crystal of the first semiconductor material is left on the temporary substrate 4, a crushed layer on the surface of the first thin film layer 22 separated by a hydrogen layer is removed by polishing (CMP) or the like. Then, as shown in FIG. 12(*b*), the single crystal layer 8 formed of the first semiconductor material is epitaxially grown on the first thin film layer 22 formed of single crystal of the first semiconductor material so as to have a thickness of 5 to 10 μm. At this time, as the single crystal layer 8, a single crystal layer 81 is formed on the first thin film layer 22, and a crystal layer 82 which is not limited to single crystal is formed on the temporary substrate 4 on which the first thin film layer 22 does not exist. Thereafter, similarly to the above, the support layer 6 is formed through the support layer forming step (FIG. 12(*c*)), the temporary substrate 4 is removed by the second separation step to form a second substrate 70 (FIG. 12(*d*)), and a peripheral edge portion 720 of the second substrate 70 can be cut by the cutting step (FIG. 12(*e*)). By removing the peripheral edge portion 720, the crystal layer 82 which is not limited to single crystal is also removed. Then, through the bonding layer removal step, the crushed layer at the bonding surface between the first thin film layer 22 and the temporary substrate 4 is removed, and a semiconductor substrate 14 on which the surface of the first thin film layer 22 having good crystallinity appears on its surface is formed.

At the interface between the support layer 6 and the single crystal layer 81 shown in FIG. 12(*c*), a potential barrier may be formed due to a bandgap difference. In this case, a high concentration impurity layer is formed on a surface of the single crystal layer 81 before forming the support layer, and the support layer 6 is used as the high concentration impurity layer, whereby interface resistance can be eliminated by inducing a tunnel phenomenon. Further, in FIG. 12(*b*), in forming the single crystal layer 81 on the first thin film layer 22, a high concentration impurity layer may be provided between the first thin film layer 22 and the single crystal layer 81 and used as a crystal defect conversion layer of the first thin film layer 22. The crystal defect conversion layer is a conversion layer which converts a killer defect existing in the first thin film layer into a defect which does not become a killer. In FIG. 12(*e*), by removing the first thin film layer 22 and the crystal defect conversion layer, only the single crystal layer 81 with few killer defects may be left.

EXAMPLES

Specific examples of the method for manufacturing the semiconductor substrate shown in FIGS. 1(*a*) to 1(*f*), 4(*a*) to 4(*d*), and 5(*a*) to 5(*e*) will be described.

In this example, the first substrate 2 of single crystal is 4H-SiC and has an outer diameter of 6 inches and a thickness of 500 μm. In the hydrogen layer forming step (refer to FIG. 1(*a*)), the hydrogen layer 3 is formed by implanting hydrogen ions of approximately $10^{20}/cm^2$ at a depth of 0.5 μm from the surface of the first substrate 2. The surface side of the first substrate 2 becomes the first thin film layer 22 with the hydrogen layer 3 as a boundary.

In the temporary substrate 4, the SiC polycrystalline layer 441 having a thickness of 1 μm is formed as a bonding layer on the carbon substrate 421 having an outer diameter of 8 inches and a thickness of 10 mm. The thickness of the carbon substrate 421 may be approximately 2 mm.

Figure 13:
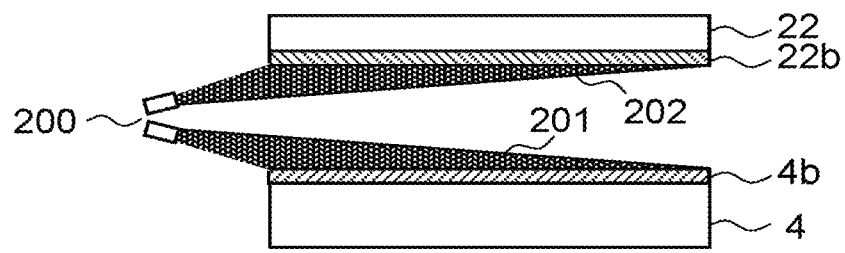
FIG. 13 is a schematic view for explaining bonding of substrates using FAB guns.

In the bonding step (refer to FIG. 1(*b*)), the surface of the first substrate 2 (the first thin film layer 22) and the temporary substrate 4 (SiC polycrystalline layer 441) are bonded. For this bonding, it is possible to use a method of activating both surfaces with an FAB gun at room temperature and bonding them together. FIG. 13 is a schematic view of a main portion of the bonding apparatus. In a vacuum chamber, the surface of the first substrate 2 (first thin film layer 22) and the surface of the temporary substrate 4 are arranged so as to be opposed to each other at a constant interval, and from the side, argon beams (201, 202) are scanned and irradiated from FAB guns 200 with respect to the both surfaces. The degree of vacuum in the vacuum chamber is approximately $1 \times 10^{-4}$ to $1 \times 10^{-6}$ Pa. By this irradiation, surface layers (22*b*, 4*b*) of both substrates are amorphized and can be bonded together at room temperature.

Then, in the first separation step (refer to FIG. 1(*c*)), the first substrate 2 bonded to the temporary substrate 4 is separated with the hydrogen layer 3 as a boundary. By raising the temperature to about 1000° C. in an inert gas atmosphere such as nitrogen, hydrogen is bubbled in the hydrogen layer 3, and the first substrate 2 cleaves to separate the base portion 24. Consequently, the first thin film layer 22 is left on the temporary substrate 4.

The base portion 24 of the first substrate 2 separated in the above manner can be used again as the first substrate 2. The thickness of the first substrate 2 is not particularly limited, and, for example, when the thickness is 1 mm at the beginning, the thickness of the first substrate 2 is only reduced by approximately 0.5 μm in a single formation of the hydrogen layer 3, and therefore, reuse of several hundred times or more can be achieved.

Then, in the buffer layer forming step (refer to FIG. 4(a)), a SiC polycrystalline layer to be the buffer layer 5 is formed with a thickness of 2 μm on the temporary substrate 4 with the first thin film layer 22 interposed therebetween. The buffer layer 5 may be formed by forming SiC polycrystal by sputtering and then performing heat treatment. Consequently, the first thin film layer 22 formed of SiC single crystal is formed on the surface of the temporary substrate 4 to have a thickness of approximately 0.5 μm, and the buffer layer 5 having a thickness of 2 μm is formed thereon.

Then, in the support layer forming step (refer to FIG. 4(b)), the SiC support layer 6 is formed on the buffer layer 5. Consequently, the bonding layer 441, the first thin film layer 22, the buffer layer 5, and the support layer 6 are stacked on the carbon substrate 421. Since the crystallinity of the support layer 6 is not limited, it is possible to grow SiC polycrystal as the support layer 6 at high speed up to approximately 300 μm thick. In order to use the support layer 6 as an N-type semiconductor, nitrogen is added so as to have a concentration of approximately $10^{21}/cm^3$.

Then, in the second separation step (refer to FIGS. 4(c) and 5(d)), the carbon substrate 421 is removed by incineration. Consequently, the second substrate 7 in which the buffer layer 5 formed of SiC polycrystal, the first thin film layer 22 formed of SiC single crystal, and the bonding layer 441 formed of SiC polycrystal are sequentially stacked on the support layer 6 formed of SiC polycrystal is obtained. In this state, the support layer 6 acts as a substrate supporting the first thin film layer 22.

Then, the peripheral edge portion 72 in a predetermined range is cut from the outer periphery of the second substrate 7 by the cutting step (refer to FIG. 4(d)). Since at least a portion exceeding the diameter of the first thin film layer 22 is removed, cutting and removal can be performed along the outer periphery of the first thin film layer 22 by circle cutting or the like. Consequently, stress occurring when the support layer 6 grows is large, and the peripheral edge portion 72 which is the cause of warpage of the substrate is removed.

Then, in the bonding layer removal step, the surface on the first thin film layer 22 side is polished to remove the bonding layer 441, and the interface where the first thin film layer 22 and the bonding layer 441 are bonded is removed. Consequently, the surface of the first thin film layer 22 having a good flatness and formed of SiC single crystal appears on the surface of the semiconductor substrate.

FIG. 14 shows the structure of the second substrate 7 before performing the cutting step. In FIG. 14, a diameter d1 of the first thin film layer 22 is 6 inches, and a diameter d5 of the buffer layer 5 and the support layer 6 is 8 inches. In the support layer 6, "A" indicates a central portion of a substrate surface of the second substrate 7, and "B" indicates a peripheral edge portion of the substrate surface. "L" indicates a range to be removed as the peripheral edge portion 72, and in the cutting step, the second substrate 7 is cut along a cutting line with a distance L from the outer periphery thereof.

Figure 15:
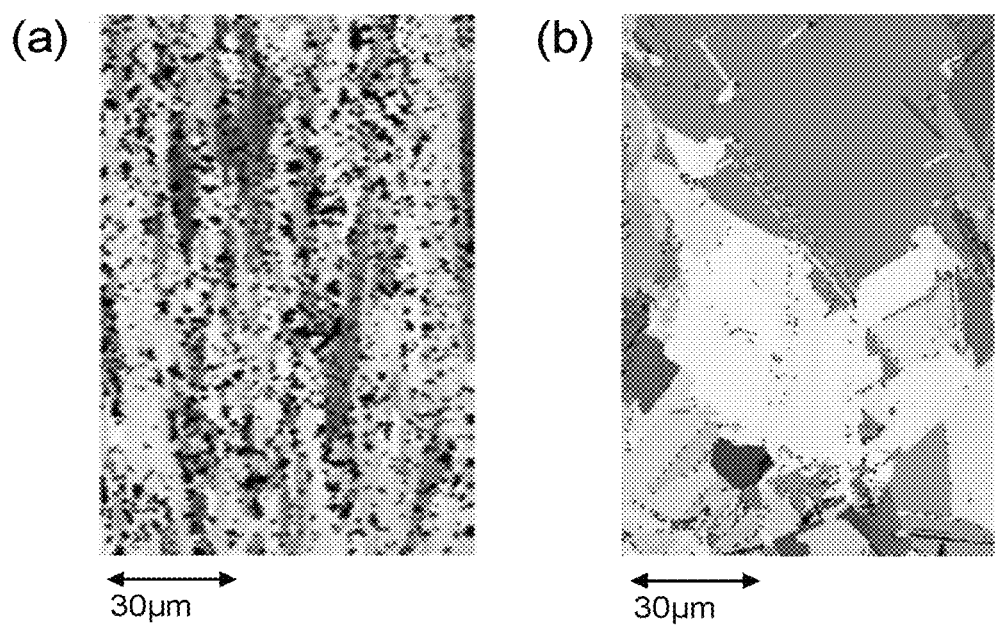
FIGS. 15(a) and 15(b) are scanning electron microscope (SEM) images showing a crystalline state at a central portion and a peripheral edge portion of the support layer formed of SiC polycrystal.

FIGS. 15(a) and 15(b) are SEM images of a creeping region of the support layer 6 formed of SiC polycrystal shown in the preceding figure. FIG. 15(a) shows EBSD (Electron Back Scatter Diffraction Patterns) in the "A" portion, that is, the central portion of the substrate surface, and FIG. 15(b) shows EBSD in the "B" portion, that is, the peripheral edge portion of the substrate surface. As is clear from this figure, disorder of crystal occurs in a surface layer portion of SiC polycrystal. In the peripheral edge portion of the substrate surface, there is discontinuity in a polycrystalline layer, which indicates that the crystallinity is greatly disturbed.

Figure 16:
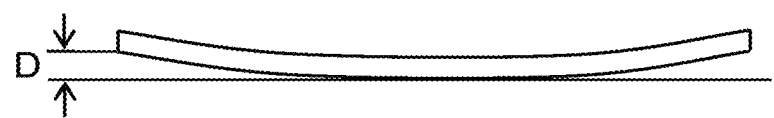
FIG. 16 is a cross-sectional view showing warpage of the semiconductor substrate.

As described above, if the temporary substrate 4 is separated in the state in which the crystallinity of the support layer 6 formed of SiC polycrystal is greatly disturbed at the peripheral edge portion, large warpage exceeding 100 μm occurs on the substrate. This warpage amount D (refer to FIG. 16) can be greatly reduced by removing the peripheral edge portion 72 in a predetermined range from the outer periphery of the second substrate 7 through the cutting step.

Figure 17:
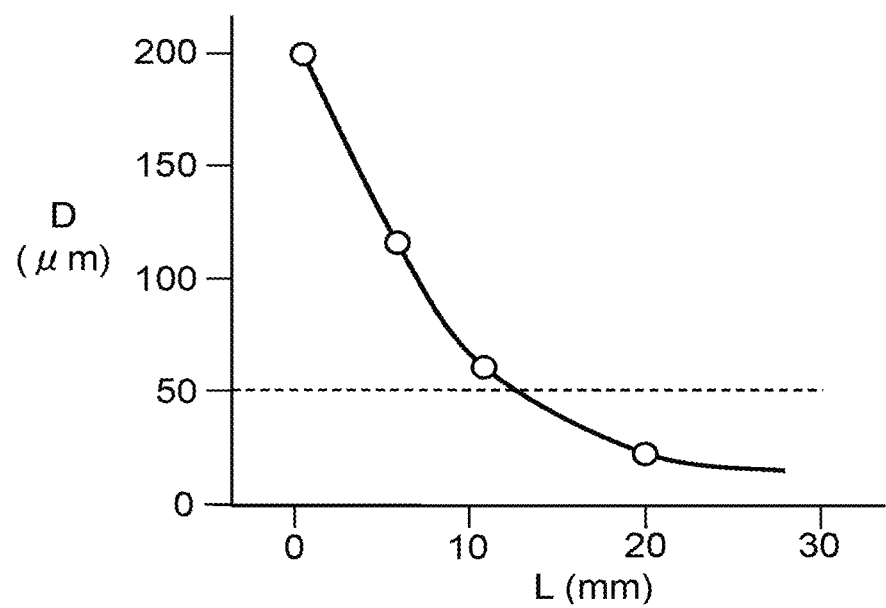
FIG. 17 is a graph showing a relationship between a range to be removed as the peripheral edge portion and magnitude of warpage of the semiconductor substrate.

FIG. 17 is a graph showing an example of a measurement result of the range of the peripheral edge portion 72 to be removed, that is, a distance L (horizontal axis) from the outer periphery of the second substrate 7 of the cutting line and the warpage amount D (vertical axis) of the substrate after removal of the peripheral edge portion 72. In this example, when the peripheral edge portion 72 is not removed (L=0 mm), large warpage (D=about 200 μm) occurs on the substrate. The warpage amount D decreases as the distance L from the outer periphery of the cutting line increases. Generally, it is necessary that the warpage amount D of the semiconductor substrate is 50 μm or less. In this example, if the peripheral edge portion is cut with the distance L from the outer periphery being about 20 mm or more, the warpage amount D becomes significantly smaller than 50 μm, so that it can be said that the requirement for a semiconductor substrate can be satisfied.

In the above example, the diameter of the first thin film layer 22 is 6 inches (about 200 mm), and the diameter of the support layer 6 is 8 inches (about 300 mm) which is the same as the diameter of the temporary substrate 4. In this case, the distance L from the outer periphery to be cut as the peripheral edge portion 72 is set to about 50 mm, whereby warpage of the substrate can be sufficiently reduced. Accordingly, by virtue of the use of the temporary substrate 4 having a diameter slightly larger than the diameter of the first substrate 2 formed of a single crystal semiconductor, an expensive single crystal semiconductor substrate can be effectively used.

In the above description, although the manufacturing method has been described taking the SiC semiconductor substrate as an example, this manufacturing method is not limited to the SiC semiconductor substrate and can be applied to a substrate for a GaN device, a substrate for a gallium oxide device, or the like.

INDUSTRIAL APPLICABILITY

Power-based compound semiconductor devices using SiC and the like are becoming increasingly important with the spread of vehicles such as hybrid vehicles and electric vehicles. In addition, with the spread of smart grids at home, the role of power-based compound semiconductor devices becomes important for controlling home appliances and energy management. According to the present invention, it is possible to greatly reduce the amount of SiC single crystal which is an expensive material, and an inexpensive SiC single crystal semiconductor substrate can be manufactured.

REFERENCE SIGNS LIST 10, 12, 14, 15, 16, 17, 18 Semiconductor substrate (before formation of single crystal layer for device formation),
2 First substrate (SiC single crystal substrate),
22 First thin film layer (SiC single crystal layer),
24 Base portion of first substrate,
25 Si thin film,
26 $SiO_2$ thin film,
28 SiC single crystal substrate
3 hydrogen layer
4, 41, 42, 43 Temporary substrate
42, 421, 422, 423 Temporary substrate body
44, 441, 442, 443 Bonding layer
45 $SiO_2$ thin film
5 Buffer layer (SiC polycrystalline layer)
6 Support layer (SiC polycrystalline layer)
7, 70 Second substrate
72, 720 Peripheral edge portion
8, 81, 82 Single crystal layer
100 Semiconductor device
101 Source
102 Drain
103 Gate
104 Drain electrode
110 Element support substrate
120 Active layer

The invention claimed is:

1. A method for manufacturing a semiconductor substrate, the method comprising:
implanting hydrogen ions at a predetermined depth from a surface of a first substrate comprising single crystal of a first semiconductor material to form a hydrogen layer;
bonding the surface of the first substrate and a temporary substrate;
separating the first substrate bonded to the temporary substrate with the hydrogen layer as a boundary to leave the separated surface side of the first substrate as a first thin film layer on the temporary substrate;
forming a support layer comprising a second semiconductor material on the temporary substrate on which the first thin film layer is left;
removing the temporary substrate to obtain a second substrate in which the first thin film layer is stacked on the support layer;
cutting a peripheral edge portion in a predetermined range from an outer periphery of the second substrate; and
epitaxially growing the first thin film layer in the second substrate such that a layer comprising the single crystal of the first semiconductor material is formed on the first thin film layer on a side opposite to the support layer,
wherein the first substrate has a disk shape or a columnar shape, an outer shape of a surface of the temporary substrate bonded to the first substrate is equal to or larger than a diameter of the first substrate, and in the cutting, at least a portion exceeding the diameter of the first thin film layer is removed as the peripheral edge portion in the predetermined range.
2. The method according to claim 1, wherein
a bonding layer is formed on a surface of the temporary substrate bonded to the first substrate,
in the removing, the temporary substrate is removed such that the bonding layer is left and stacked on the second substrate, and
the method further comprises: removing the bonding layer from the second substrate.
3. The method according to claim 2, wherein the temporary substrate is a carbon substrate, and the bonding layer comprises SiC polycrystal.
4. The method f according to claim 2, wherein the temporary substrate is a SiC substrate, and the bonding layer comprises $SiO_2$.
5. The method according to claim 1, wherein
a first bonding layer is formed on the surface of the first substrate,
a second bonding layer is formed on the surface of the temporary substrate,
in the bonding, the surface of the first substrate on which the first bonding layer is formed and the surface of the temporary substrate on which the second bonding layer is formed are bonded to each other,
the first bonding layer comprises one of $SiO_2$ and Si, and the second bonding layer comprises the other one of $SiO_2$ and Si.
6. The method according to claim 5, wherein the temporary substrate is a carbon substrate, the first bonding layer comprises Si, and the second bonding layer comprises $SiO_2$.
7. The method according to claim 1, wherein
a first bonding layer comprising $SiO_2$ is formed on the surface of the first substrate,
the temporary substrate is a Si substrate, and
in the bonding, the surface of the first substrate on which the first bonding layer is formed and a surface of the Si substrate are bonded to each other.
8. The method according to claim 1, further comprising:
after the separating, forming a buffer layer comprising a third semiconductor material on the temporary substrate on the side where the first thin film layer is left,
wherein in the forming, the support layer is formed on the buffer layer such that the buffer layer and the first thin film layer are stacked on the support layer in the second substrate.
9. The method according to claim 1, wherein the first semiconductor material and the second semiconductor material are SiC, and the support layer comprises single crystal or polycrystal.
10. The method according to claim 1, wherein the first semiconductor material is GaN or gallium oxide, the second semiconductor material is SiC, and the support layer comprises single crystal or polycrystal.
11. The method according to claim 8, wherein the third semiconductor material is SiC, and the buffer layer is polycrystalline or amorphous.
12. The method according claim 1, further comprising:
introducing a high-concentration impurity into at least one of a surface layer portion of the first thin film layer and an interface portion of the support layer on the side of the first thin film layer.
13. The method according to claim 1, wherein
in the removing, the temporary substrate is removed at the surface of the first substrate bonded to the temporary substrate in the bonding.
14. The method according to claim 1, wherein the first thin film layer is not epitaxially grown prior to the forming of the support layer.

* * * * *